(12) United States Patent
Hu

(10) Patent No.: US 9,431,335 B2
(45) Date of Patent: Aug. 30, 2016

(54) MOLDING COMPOUND SUPPORTED RDL FOR IC PACKAGE

(71) Applicant: Dyi-Chung Hu, Hsinchu County (TW)

(72) Inventor: Dyi-Chung Hu, Hsinchu County (TW)

( * ) Notice: Subject to any disclaimer, the term of this patent is extended or adjusted under 35 U.S.C. 154(b) by 0 days.

(21) Appl. No.: 14/559,696

(22) Filed: Dec. 3, 2014

(65) Prior Publication Data

US 2016/0118328 A1    Apr. 28, 2016

Related U.S. Application Data

(63) Continuation-in-part of application No. 14/522,760, filed on Oct. 24, 2014.

(51) Int. Cl.

| | |
|---|---|
| *H01L 23/48* | (2006.01) |
| *H01L 21/3105* | (2006.01) |
| *H01L 31/147* | (2006.01) |
| *H01L 23/495* | (2006.01) |
| *H01L 33/44* | (2010.01) |
| *H01L 23/498* | (2006.01) |
| *H01L 21/48* | (2006.01) |
| *H01L 21/56* | (2006.01) |

(52) U.S. Cl.
CPC ....... *H01L 23/49894* (2013.01); *H01L 21/481* (2013.01); *H01L 21/486* (2013.01); *H01L 21/4853* (2013.01); *H01L 21/566* (2013.01); *H01L 21/568* (2013.01); *H01L 23/49816* (2013.01); *H01L 23/49827* (2013.01); *H01L 23/49838* (2013.01); *H01L 23/49861* (2013.01)

(58) Field of Classification Search
CPC ............... H01L 21/4846; H01L 23/49816; H01L 23/49822
USPC .......... 174/266; 257/676, E21.597, E23.011; 438/124, 126
See application file for complete search history.

(56) References Cited

U.S. PATENT DOCUMENTS

| | | | |
|---|---|---|---|
| 2013/0228921 A1* | 9/2013 | Hung | H01L 23/3128 257/738 |
| 2013/0242493 A1* | 9/2013 | Shenoy | H01L 23/49827 361/679.21 |
| 2013/0277841 A1* | 10/2013 | Lii | H01L 25/105 257/741 |
| 2014/0102777 A1 | 4/2014 | Chen et al. | |
| 2015/0001708 A1* | 1/2015 | Lin | H01L 25/105 257/737 |
| 2015/0340332 A1* | 11/2015 | Rinne | H01L 24/13 257/737 |

* cited by examiner

*Primary Examiner* — Kimberly Rizkallah
*Assistant Examiner* — Brian Turner
(74) *Attorney, Agent, or Firm* — Hauptman Ham, LLP

(57) ABSTRACT

A cylindrical molding compound supported RDL for IC package is disclosed wherein a central cavity is formed in the center of the molding compound. A plurality of metal pillar is embedded in the molding compound, a redistribution layer is configured on bottom of the plurality of metal pillar; at least one passive element such as a capacitor can be mounted in the central cavity. The bottom of the package is adaptive for at least one chip to mount so that the passive element is close to the chip and therefore simultaneous switching noise (SSN) can be reduced to a minimum at the initial first stage when a power is turned on.

19 Claims, 29 Drawing Sheets

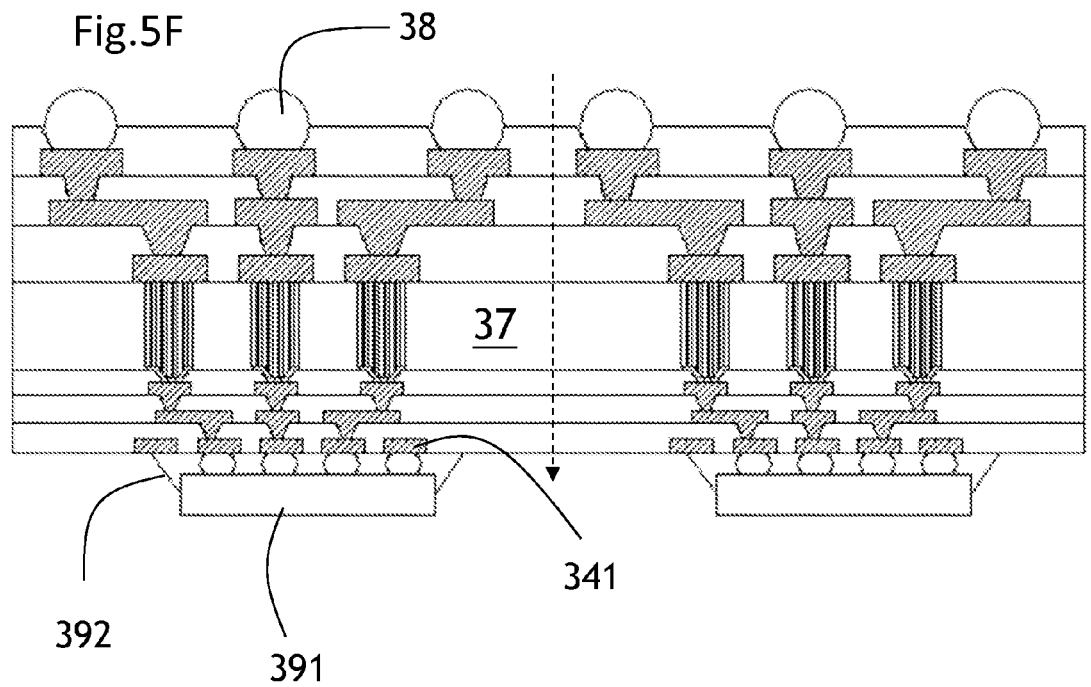
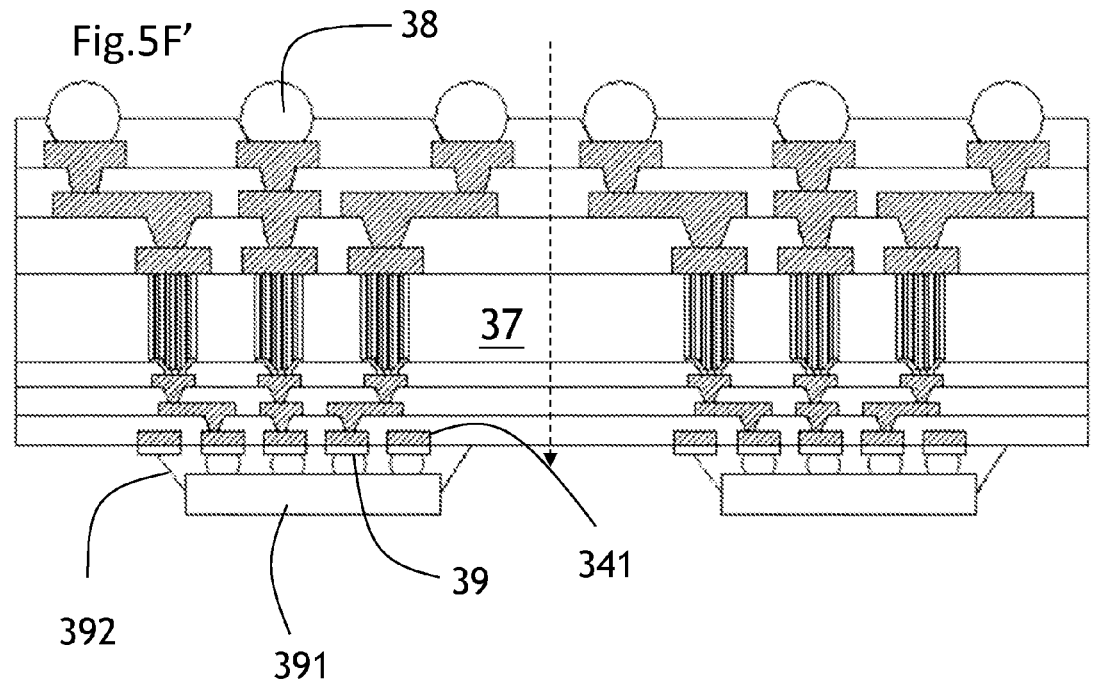

MOLDING COMPOUND SUPPORTED RDL FOR IC PACKAGE

This application is a continuation-in-part application of U.S. application Ser. No. 14/522,760 filed Oct. 24, 2014, the disclosure of which is incorporated by reference herein in its entirety.

BACKGROUND

1. Technical Field

The present invention relates to a redistribution layer (RDL) for IC package, especially relates to an RDL supported by molding compound.

2. Description of Related Art

FIG. 1A shows a prior art substrate for IC package

FIG. 1A shows a prior art substrate for IC package disclosed in US2014/0102777A1 which has an embedded silicon interposer 20. The silicon interposer 20 has four lateral sides 206. A molding compound 22 wraps the silicon interposer 20 around the four lateral sides 206. A plurality of via metal 200 is made through the silicon interposer 20. An insulation liner 201 is made between the through via 200 and the silicon interposer 20 for an electrical insulation therebetween. A top redistribution layer 21 is made on top of the silicon interposer 20 with a plurality of metal pad 210 exposed on top. The plurality of metal pad 210 on top is provided for accommodating an IC chip (not shown) to mount. A circuit built-up layer 25 is made on bottom of the silicon interposer 20 with a plurality of metal pad 220 configured on bottom. A plurality of solder ball 24 is configured and each solder ball 24 is configured on bottom of a corresponding bottom metal pad 220.

FIG. 1B shows a reversed view of FIG. 1A. FIG. 1B is made to present the prior art of FIG. 1A in a position similar to a package substrate of the present invention to facilitate a comparison there between. FIG. 1B shows an up-down view of FIG. 1A. The top solder ball 24 is configured for mounting the package substrate onto a mother board (not shown). The bottom metal pad 210 is configured for a chip or chips to mount.

BRIEF DESCRIPTION OF THE DRAWINGS

'
FIGS. 2A~2L and 4A~4C, shows a manufacturing process according to the present invention.
'
FIGS. 2A~2L and 5A~5C, shows a manufacturing process according to the present invention.
FIG. 5F shows an IC chip mounted on bottom of FIG. 5D
FIG. 5F' shows an IC chip mounted on bottom of FIG. 5E

DETAILED DESCRIPTION OF THE INVENTION

FIGS. 2A~2L and 3A~3C, Shows a Manufacturing Process According to the Present Invention. FIG. 3D is a First Embodiment of the Present Invention; and FIG. 3E is a Second Embodiment of the Present Invention.

Figure 1A:
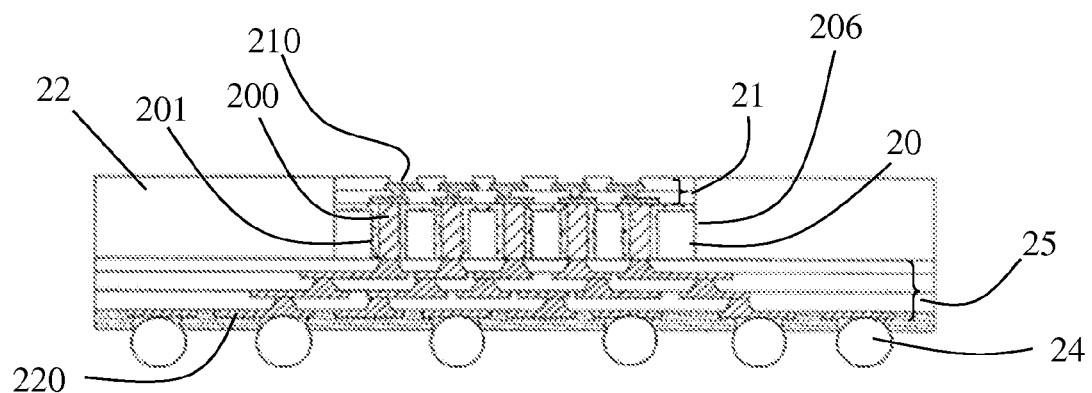
FIG. 1A~1B show a prior art substrate for IC package
Figure 1B:
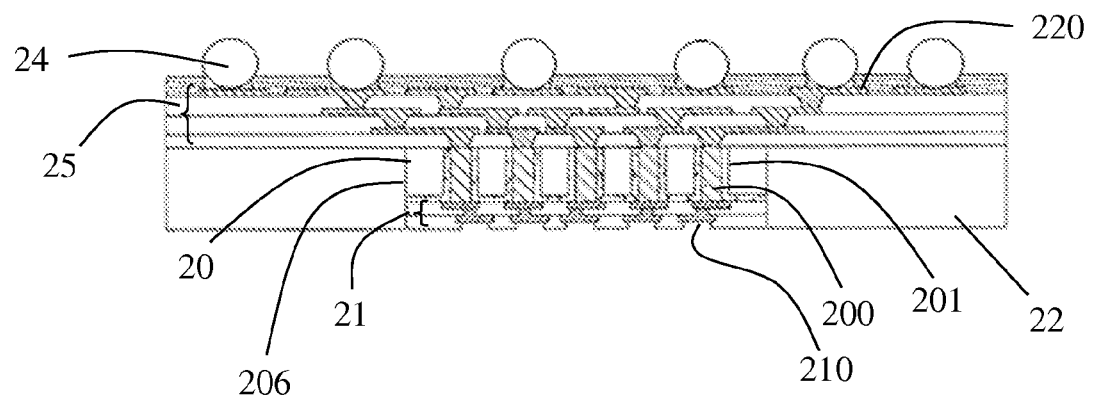
Figure 2A:
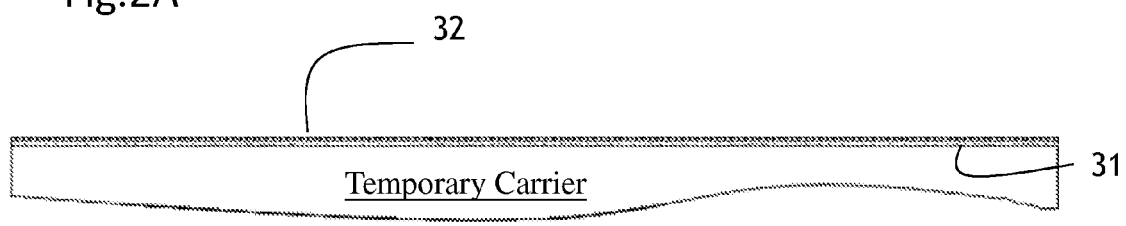
FIGS. 2A~2L and 3A~3C, shows a manufacturing process according to the present invention.

A molding compound supported RDL for IC package is fabricated, includes the following steps:

FIG. 2A shows: preparing a temporary carrier; applying a release layer 31 on top of the temporary carrier; and applying a bottom seed layer 32 on top of the release layer 31.

Figure 2B:
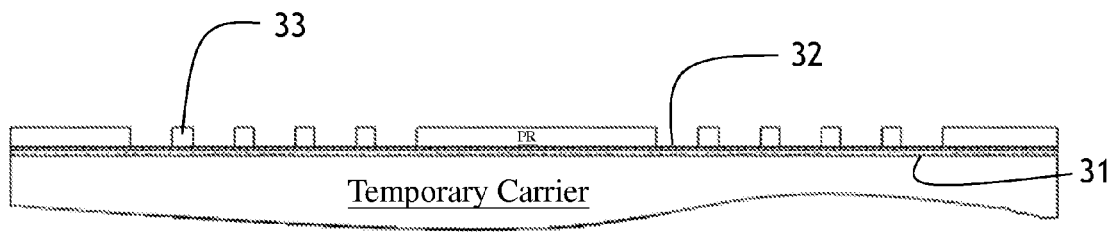

FIG. 2B shows: applying a patterned photo resist 33 on top of the bottom seed layer 32.

Figure 2C:
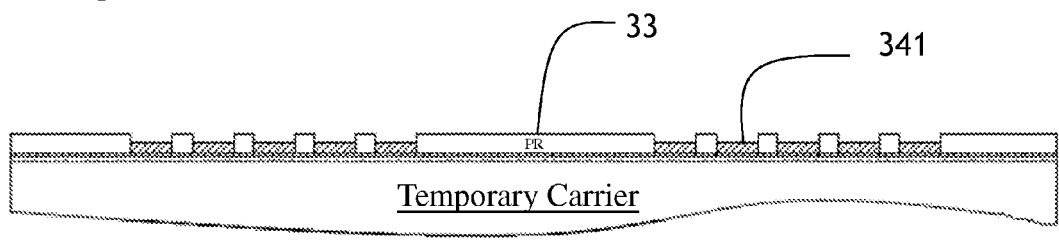

FIG. 2C shows: forming a patterned first bottom metal pad 341.

Figure 2D:
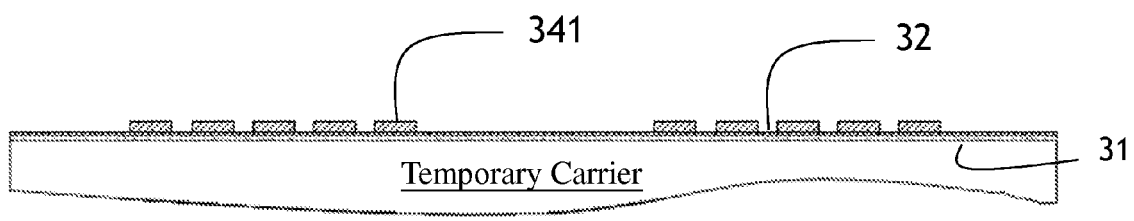

FIG. 2D shows: stripping the photo-resist 33.

Figure 2E:
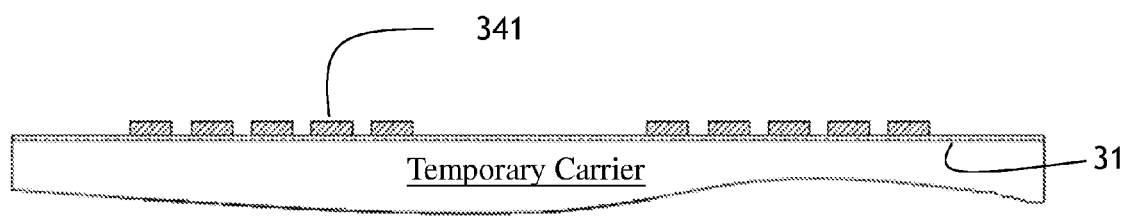

FIG. 2E shows: stripping the bottom seed layer 32 between the first bottom metal pads 341.

Figure 2F:
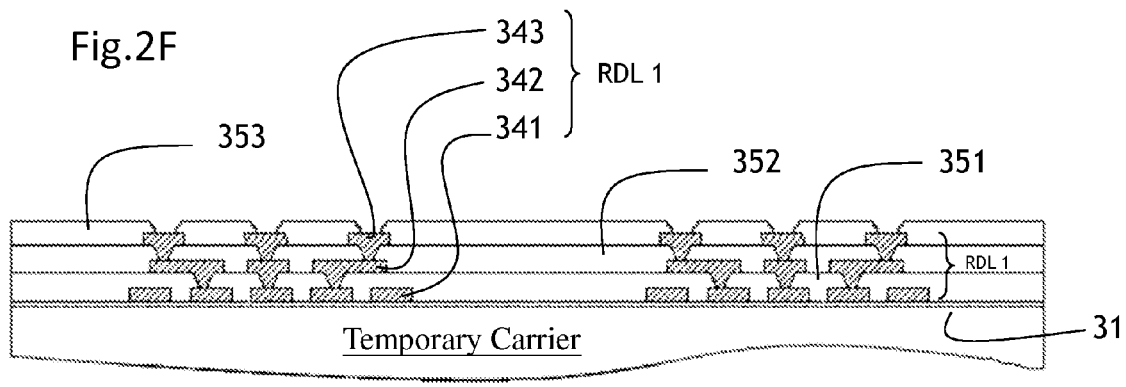
Figure 2G:
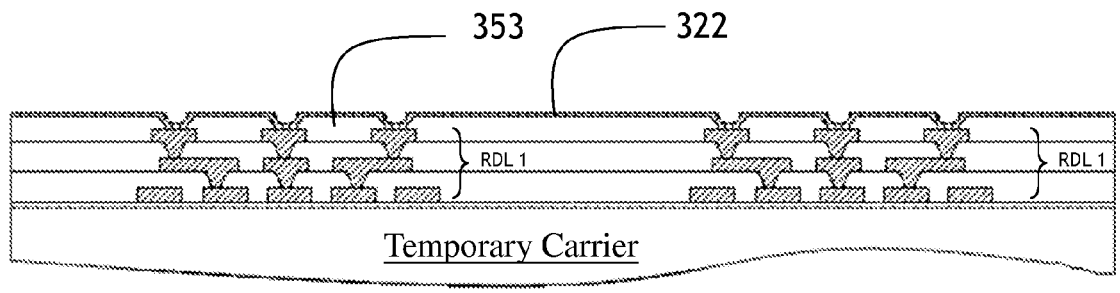
Figure 2H:
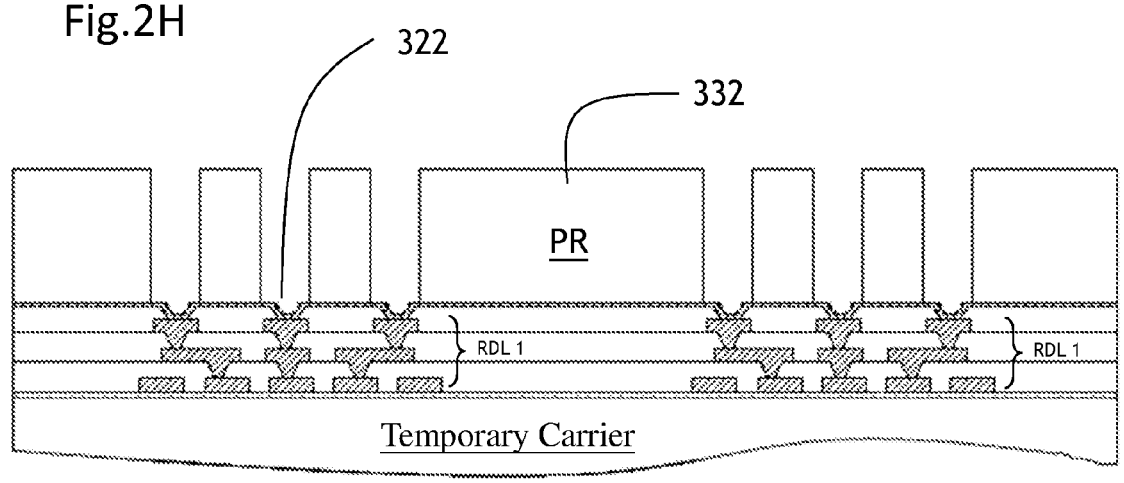
Figure 2I:
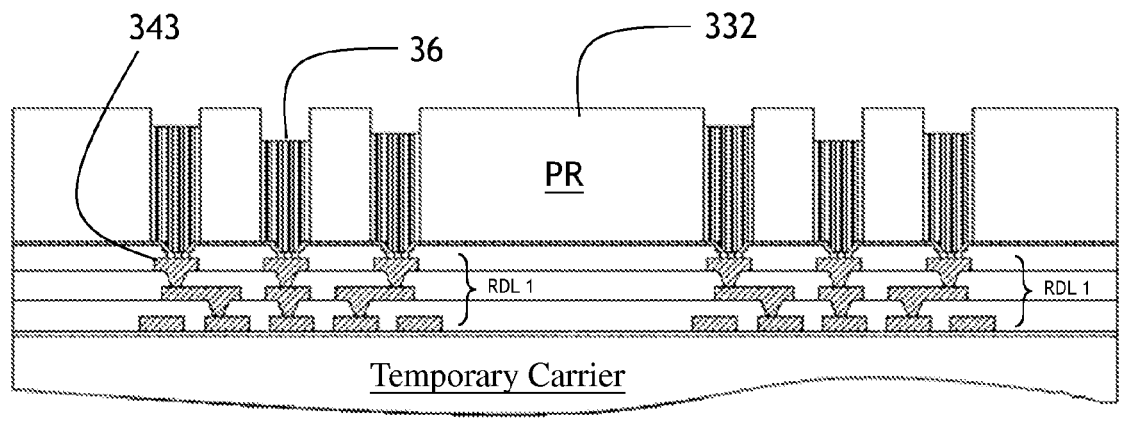
Figure 2J:
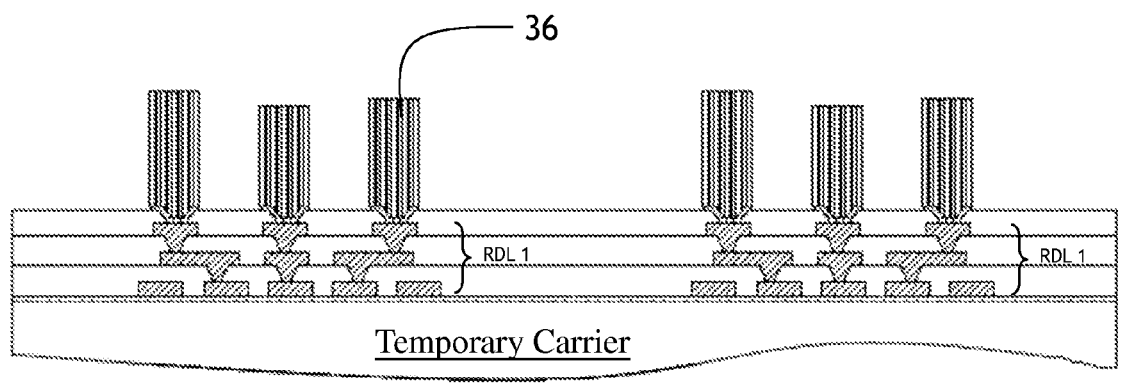
Figure 2K:
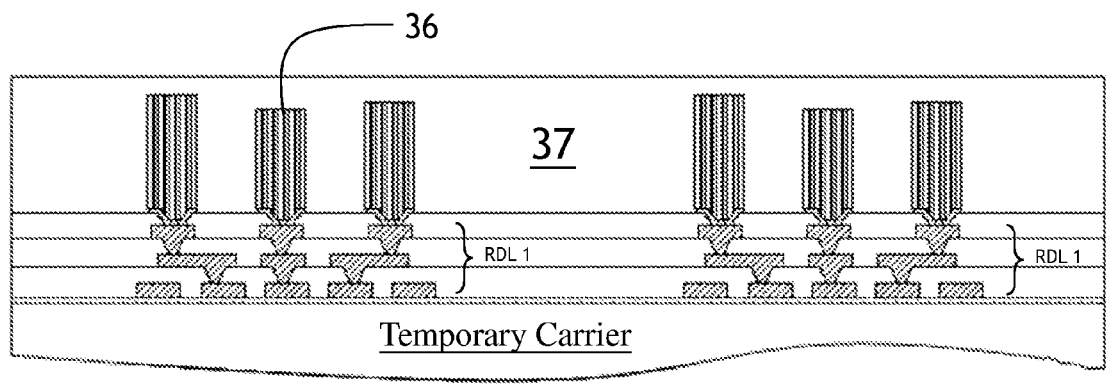
Figure 2L:
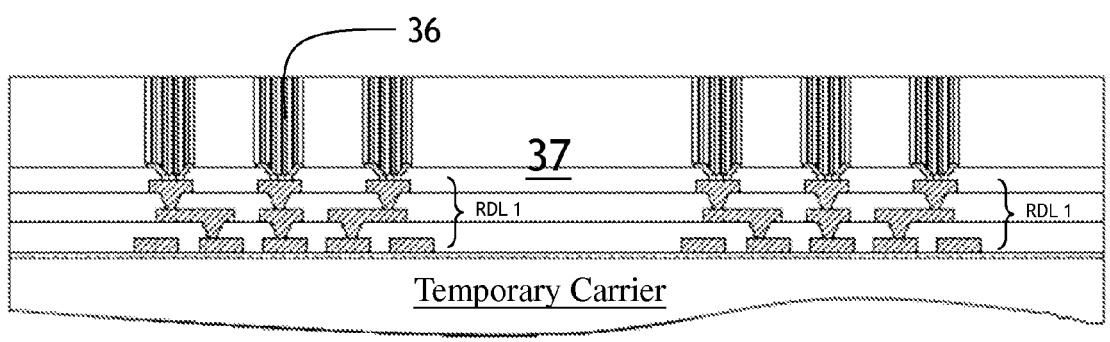

FIG. 2F shows: forming a bottom RDL (RDL 1) using the first bottom metal pad 341 as a starting point; forming a plurality of first top metal pad 343 on top of the bottom RDL (RDL 1), wherein at least one circuit layer 342 is made between the first bottom metal pad 341 and the first top metal pad 343. A first top dielectric layer 353 is formed on top of the first top metal pad 343 and a plurality opening is made to expose a top of each first top metal pad 343. The first bottom metal pad 341, circuit layer 342, and the first top metal pad 343 are embedded in the dielectric layers 351, 352, 353; forming a first top dielectric layer with a plurality of opening, each opening exposes a top of a corresponding first top metal pad;

FIG. 2G shows: applying a top seed layer 322 on top of the first top dielectric layer 353 and the first top metal pad;

FIG. 2H shows: forming a patterned photo resist 332 on top of the top seed layer 322;

FIG. 2I shows: forming a plurality of metal pillar 36, each is formed on top of a corresponding first top metal pad 343;

FIG. 2J show: stripping the photo resist 332 and leaving the metal pillar 36 exposed;

stripping the top seed layer 322 between metal pillars 36;
revealing the plurality of metal pillar;

FIG. 2K shows: applying a molding compound 37 to encapsulate the plurality of metal pillar 36;

FIG. 2L shows: thinning from top of the molding compound 37; and revealing a top surface of each metal pillar 36.

Figure 3A:
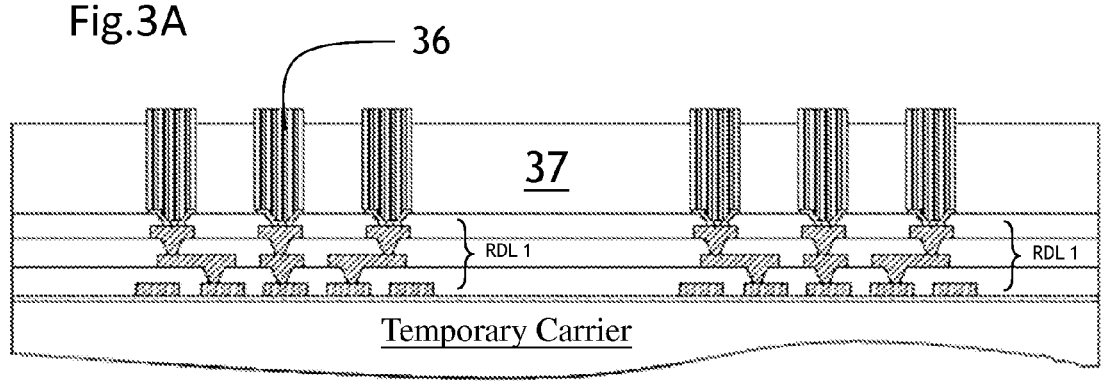
Figure 3B:
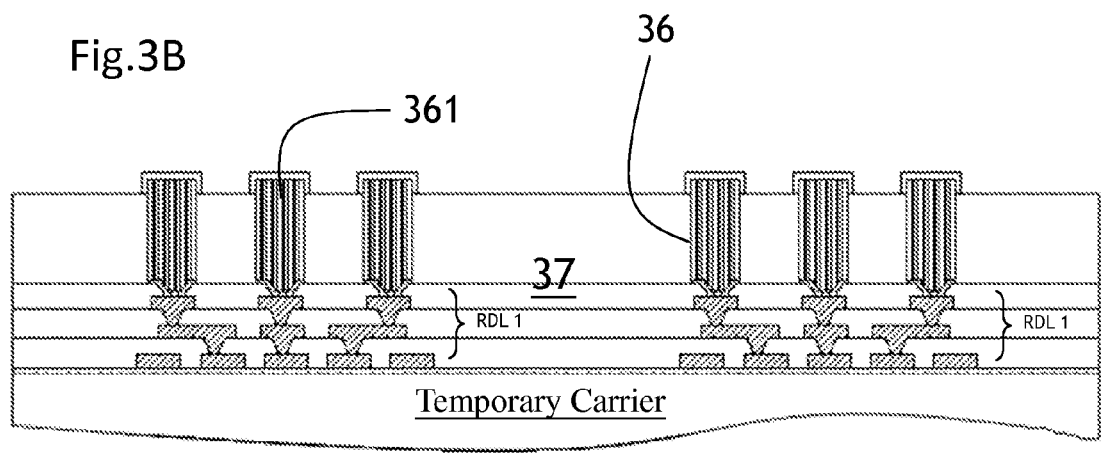
Figure 3C:
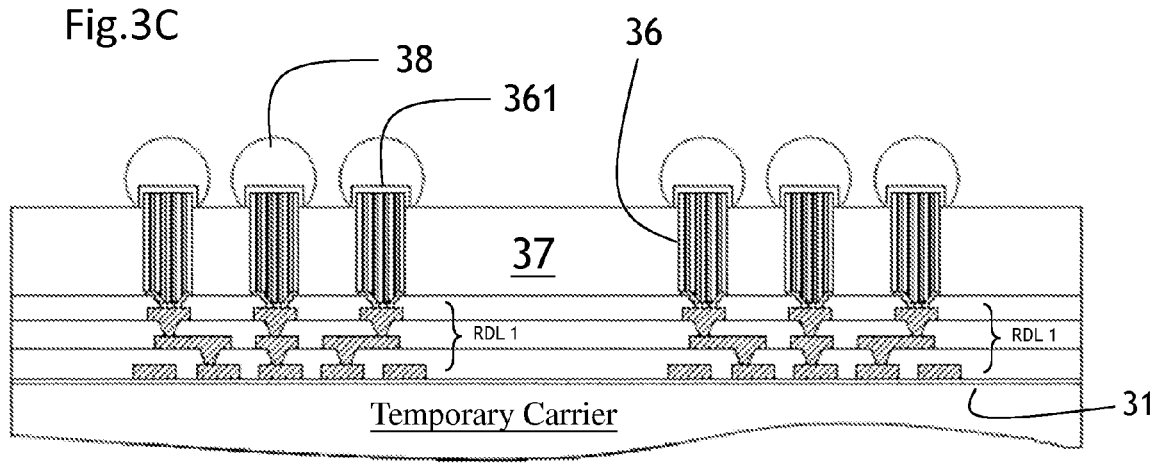
Figure 3D:
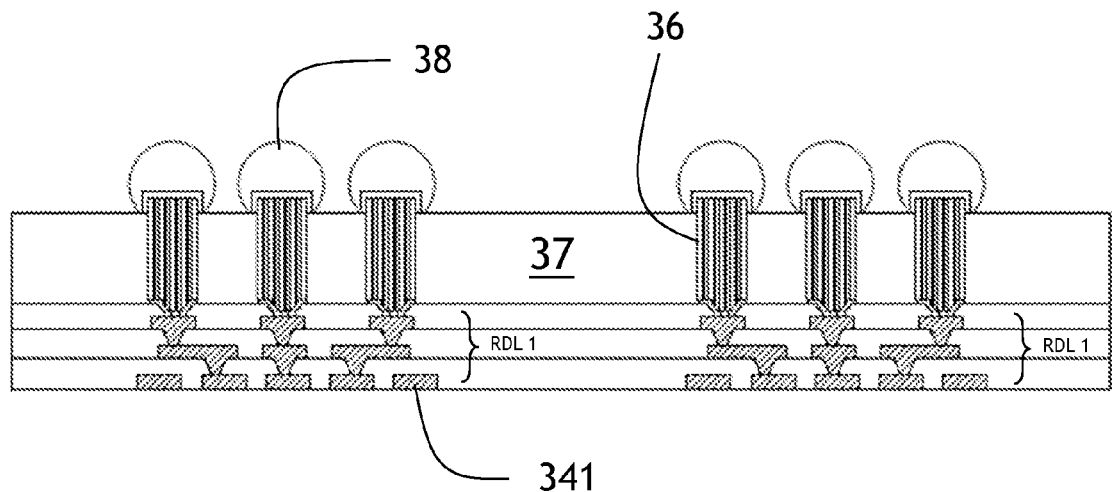
FIG. 3D is a first embodiment of the present invention.
Figure 3E:
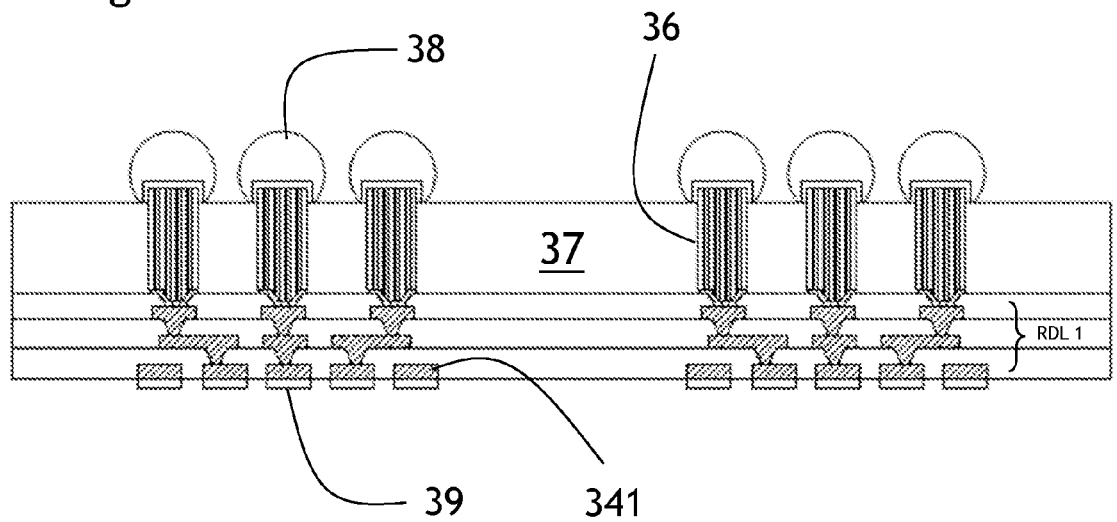
FIG. 3E is a second embodiment of the present invention.

FIG. 3A shows: removing portion of the molding compound 37 from top;

revealing a top end of each metal pillar 36;

FIG. 3B shows: forming a protection layer 361, such as an Electroless Nickel/Electroless Palladium/Immersion Gold (ENEPIG), on each revealed top of the metal pillar 36;

FIG. 3C shows: planting a plurality of solder ball 38, each is planted on top of a corresponding ENEPIG 362 which brackets a top end of a corresponding metal pillar 36;

FIG. 3D shows: removing the temporary carrier; and removing the bottom seed layer 32 from bottom of each first bottom metal pad 341. FIG. 3D shows a molding compound 37 wrapping a plurality of metal pillar 36, a protection layer 361 is configured on top of a corresponding metal pillar 36; a solder ball is configured on top of each protection layer 361; a bottom RDL (RDL 1) is made on bottom of the molding compound 37.

FIG. 3E shows: forming a bottom protection layer 39 on bottom of a corresponding first bottom metal pad 341. The protection layer is ENEPIG. The protection layer prevents oxidation of the exposed end of the metal pillar 36 before next step. FIG. 3E shows a molding compound 37 wrapping a plurality of metal pillar 36, a protection layer 361 is configured on top of a corresponding metal pillar 36; a solder ball is configured on top of each protection layer 361; a bottom RDL (RDL 1) is made on bottom of the molding compound 37; a bottom protection layer 39 is made on bottom of a corresponding first bottom metal pad 341.

Figure 3F:
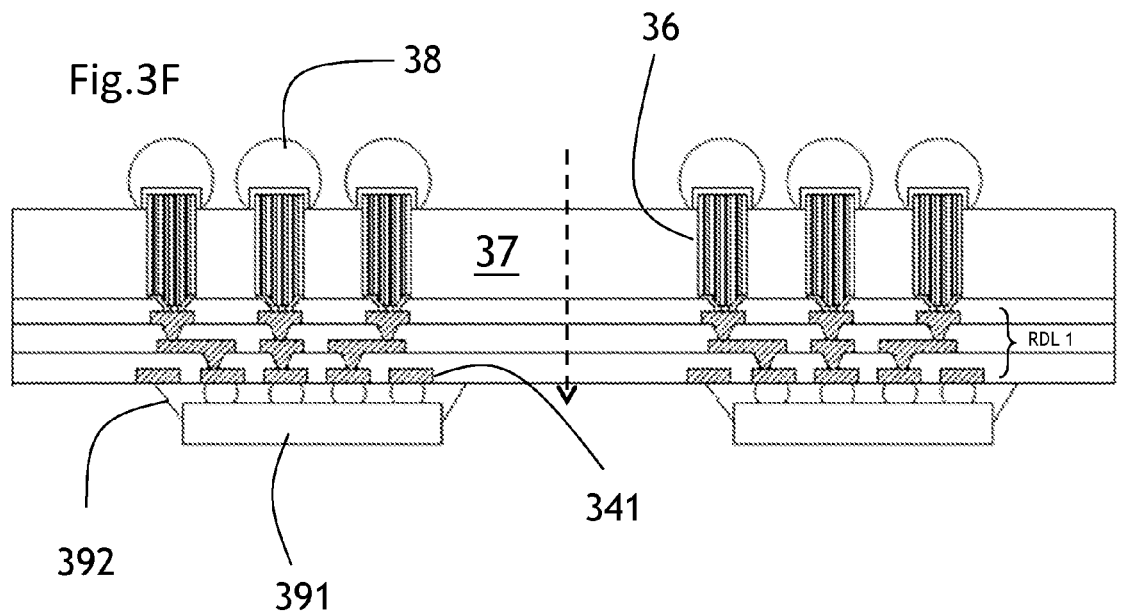
FIG. 3F shows an IC chip mounted on bottom of FIG. 3D
FIG. 3F' shows an IC chip mounted on bottom of FIG. 3E
Figure 3F:
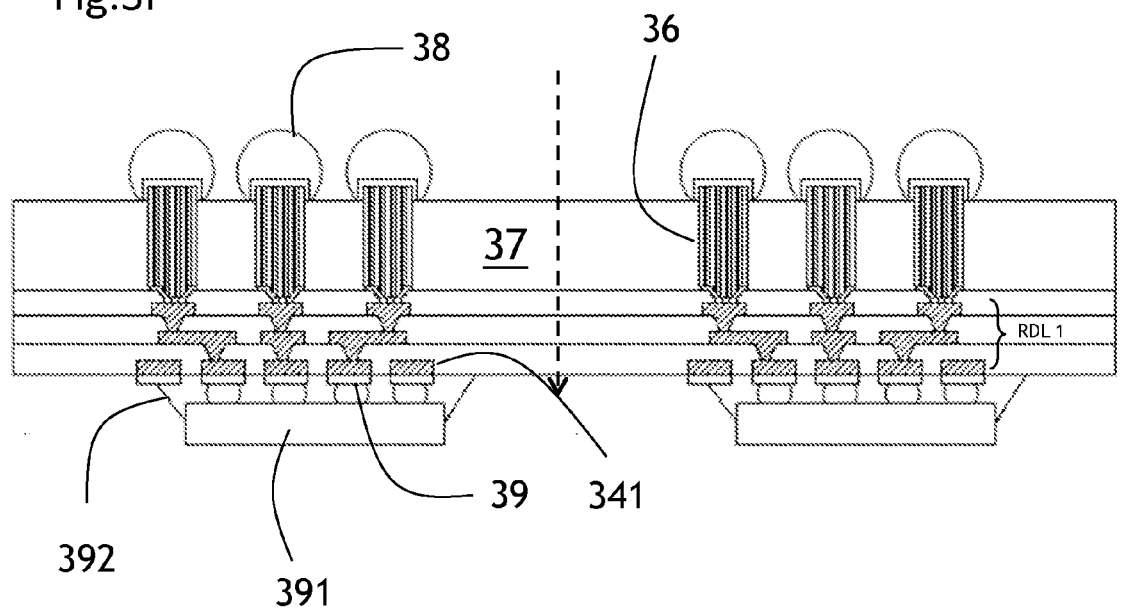

FIG. 3F Shows an IC Chip Mounted on Bottom of FIG. 3D

FIG. 3F shows a chip 391 mounted on bottom of FIG. 3D; the chip 391 is electrically coupled to the first bottom metal pad 341 through a plurality of solder ball. An under fill 392 can be made between the chip 391 and the first bottom metal pad 341.

FIG. 3F' Shows an IC Chip Mounted on Bottom of FIG. 3E

FIG. 3F' shows a chip 391 mounted on bottom of FIG. 3E; the chip 391 is electrically coupled to the bottom protection layer 39 through a plurality of solder ball. An under fill 392 can be made between the chip 391 and the bottom protection layer 39.

Figure 3G:
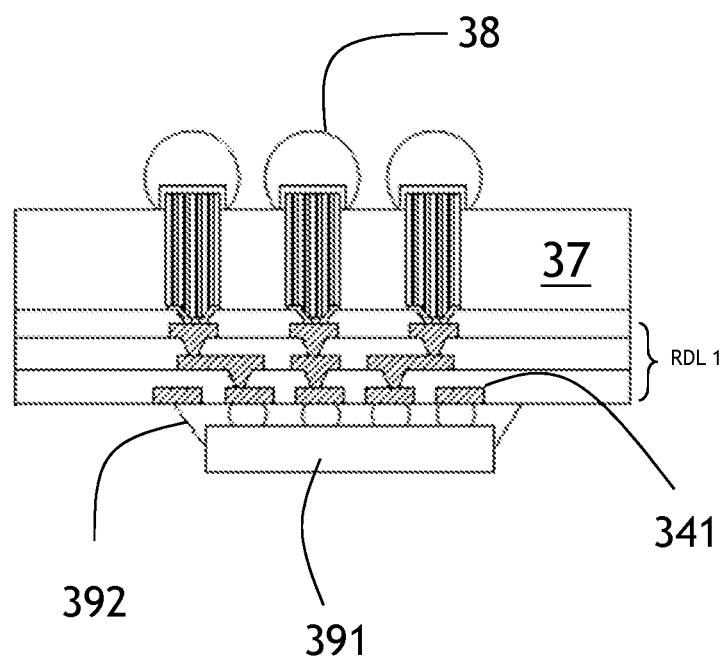
FIG. 3G shows an IC package unit obtained through singulating the product of FIG. 3F.
Figure 3G:
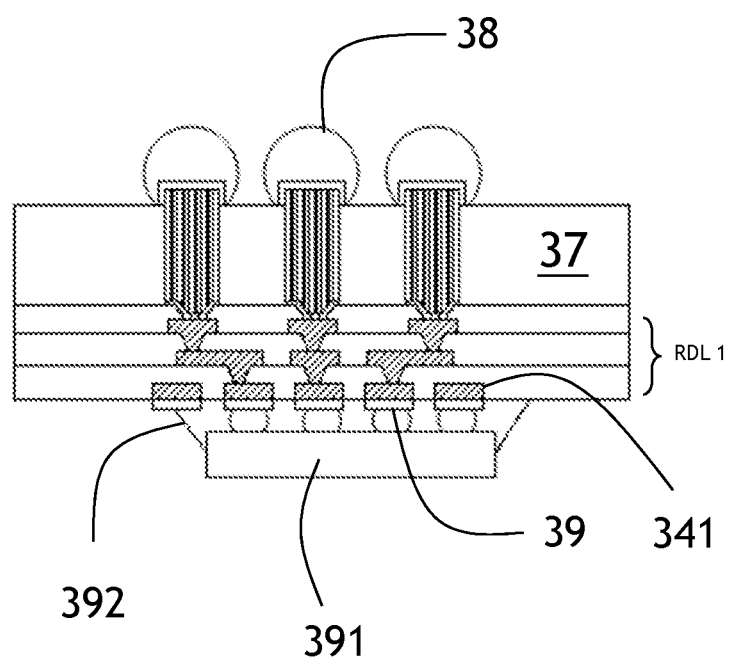

FIG. 3G Shows an IC Package Unit Obtained through Singulating the Product of FIG. 3F.

FIG. 3G shows an IC package which is a package based on the molding compound supported RDL of the first embodiment according to the present invention.

FIG. 3G' Shows an IC Package Unit Obtained through Singulating the Product of FIG. 3F'

FIG. 3G' shows an IC package which is a package based on the molding compound supported RDL of the second embodiment according to the present invention.

FIGS. 2A~2L and 4A~4C, Shows a Manufacturing Process According to the Present Invention. FIG. 4D is a Third Embodiment of the Present Invention. FIG. 4E is a Fourth Embodiment of the Present Invention.

The manufacturing process of FIGS. 2A~2L is the same as described in previous paragraph and omitted here for simplification.

Figure 4A:
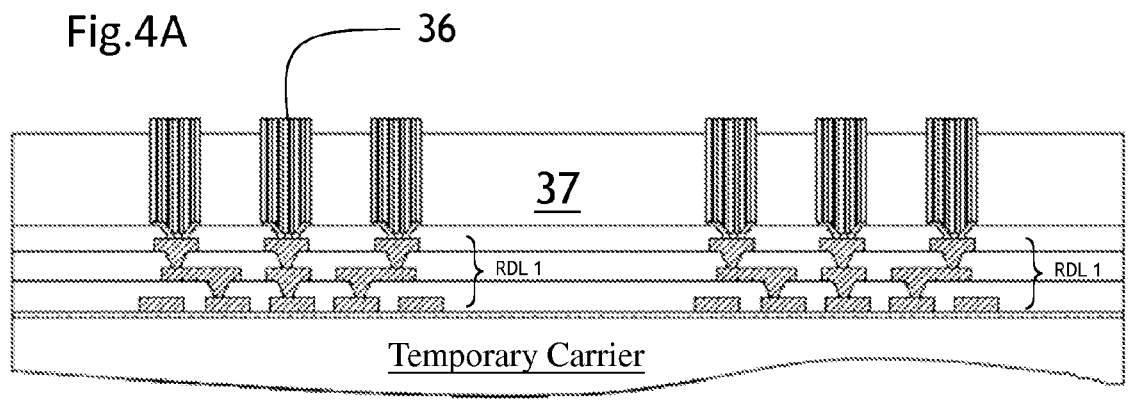
Figure 4B:
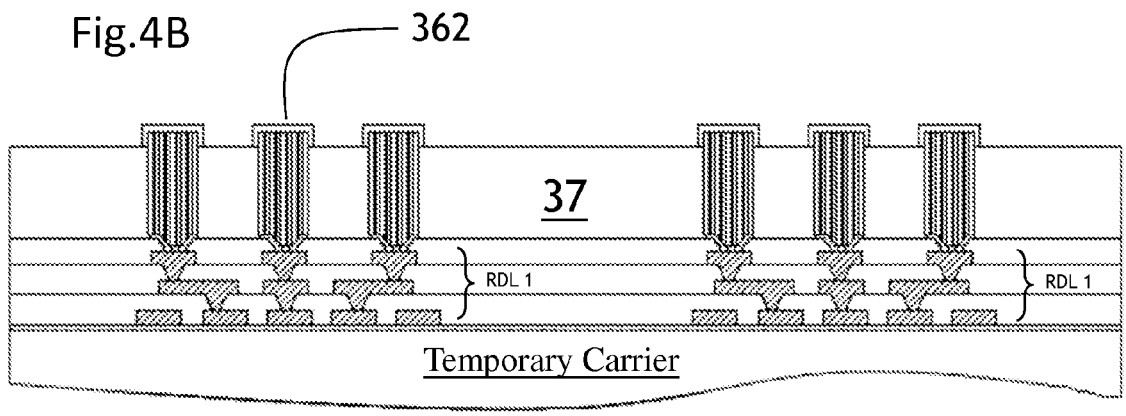

FIG. 4A shows: removing portion of the molding compound 37 from top;
revealing a top end of each metal pillar 36;

FIG. 4B shows: forming a protection layer 362, such as an Organic Solderability Preservatives (OSP), on each revealed top of the metal pillar 36. The protection layer prevents oxidation of the exposed end of the metal pillar 36 before next step.

Figure 4C:
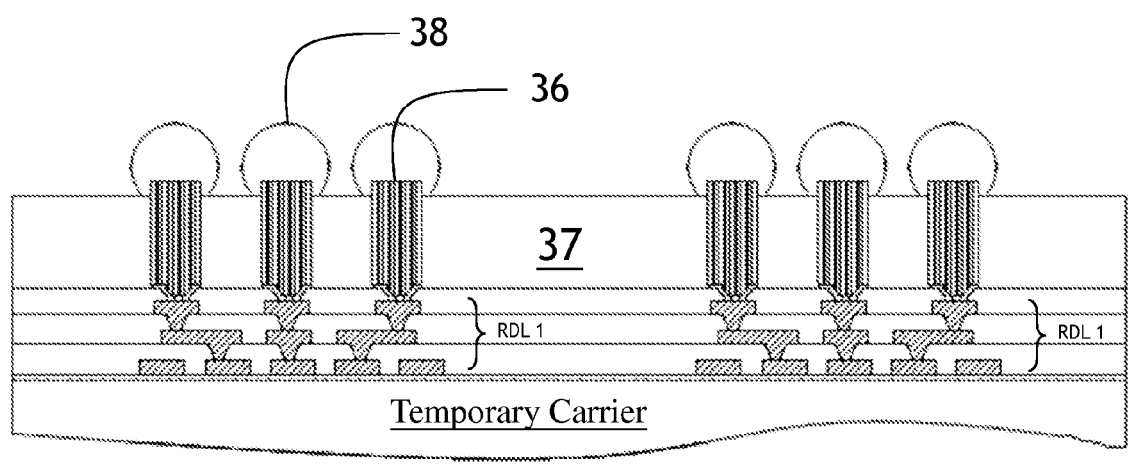
Figure 4D:
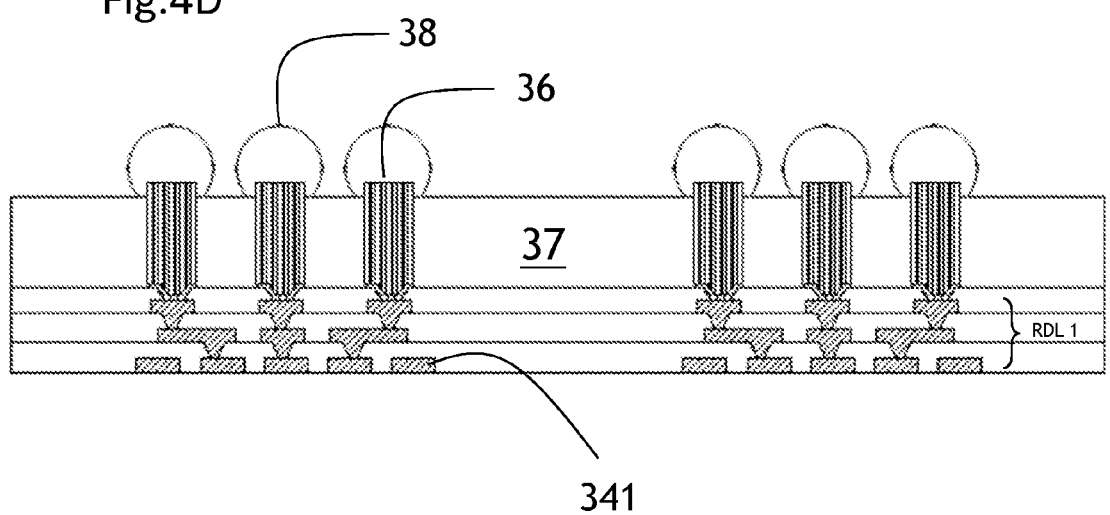
FIG. 4D is a third embodiment of the present invention.
Figure 4E:
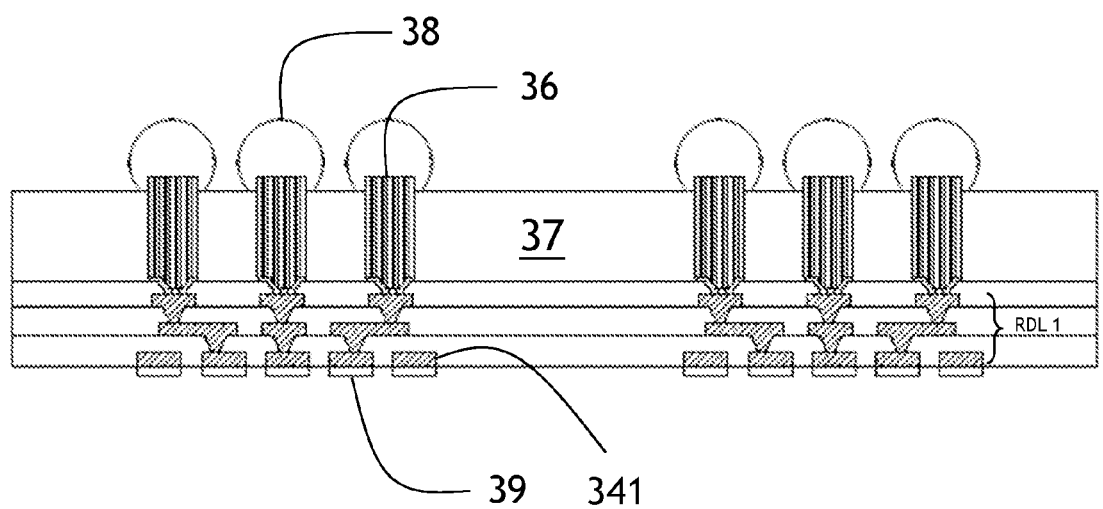
FIG. 4E is a fourth embodiment of the present invention.

FIG. 4C shows: planting a plurality of solder ball 38, each is planted on top of a corresponding protection layer 362, however OSP is cleaned out by soldering flux and heat; therefore, the solder ball 38 can be seen planted directly on a top of a corresponding metal pillar 36.

FIG. 4D shows: removing the temporary carrier; and removing the seed layer 32 from bottom of each first bottom metal pad 341.

FIG. 4E shows: forming a bottom protection layer 39 on bottom of a corresponding first bottom metal pad 341. The protection layer is ENEPIG. FIG. 4E shows a molding compound 37 wrapping a plurality of metal pillar 36; a solder ball is configured on top of a corresponding metal pillar 36; a bottom RDL (RDL 1) is made on bottom of the molding compound 37; a bottom protection layer 39 is made on bottom of a corresponding first bottom metal pad 341.

Figure 4F:
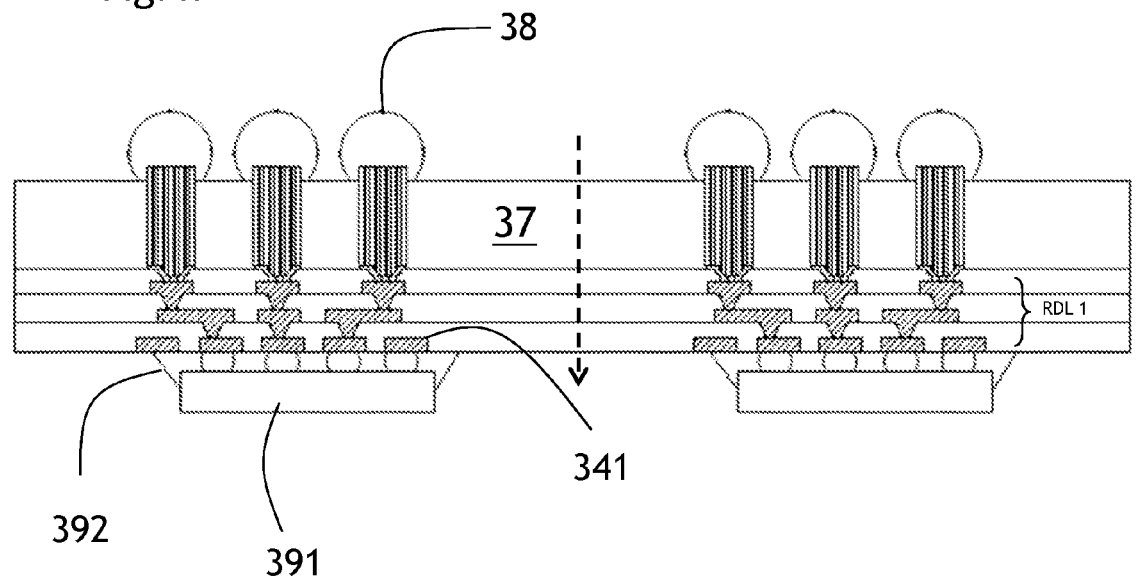
FIG. 4F shows an IC chip mounted on bottom of FIG. 4D
FIG. 4F' shows an IC chip mounted on bottom of FIG. 4E
Figure 4F:
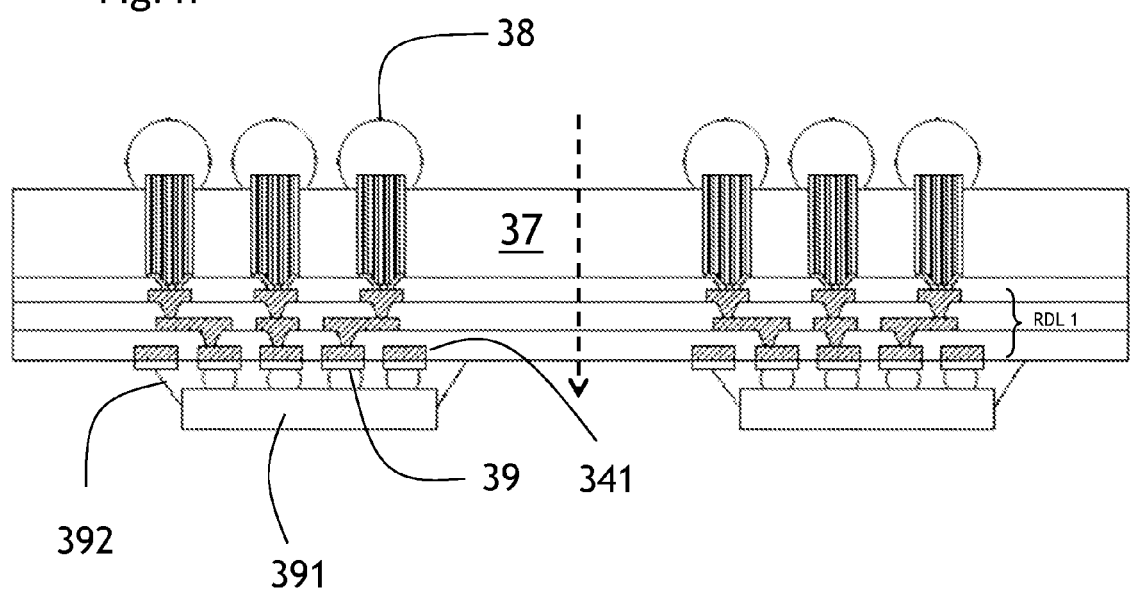

FIG. 4F Shows an IC Chip Mounted on Bottom of FIG. 4D

FIG. 4F shows an IC chip mounted on bottom of FIG. 4D; the chip 391 is electrically coupled to the first bottom metal pad 341 through a plurality of solder ball. An under fill 392 can be made between the chip 391 and the first bottom metal pad 341.

FIG. 4F' Shows an IC Chip Mounted on Bottom of FIG. 4E

FIG. 4F' shows an IC chip 391 mounted on bottom of FIG. 4E; the chip 391 is electrically coupled to the bottom protection layer 39 through a plurality of solder ball. An under fill 392 can be made between the chip 391 and the bottom protection layer 39.

Figure 4G:
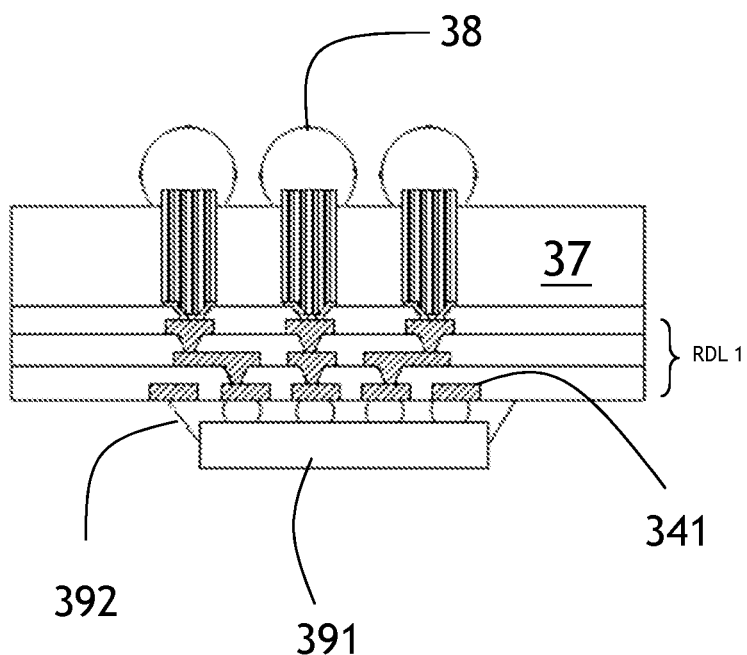
FIG. 4G shows an IC package unit obtained through singulating the product of FIG. 4F.
Figure 4G:
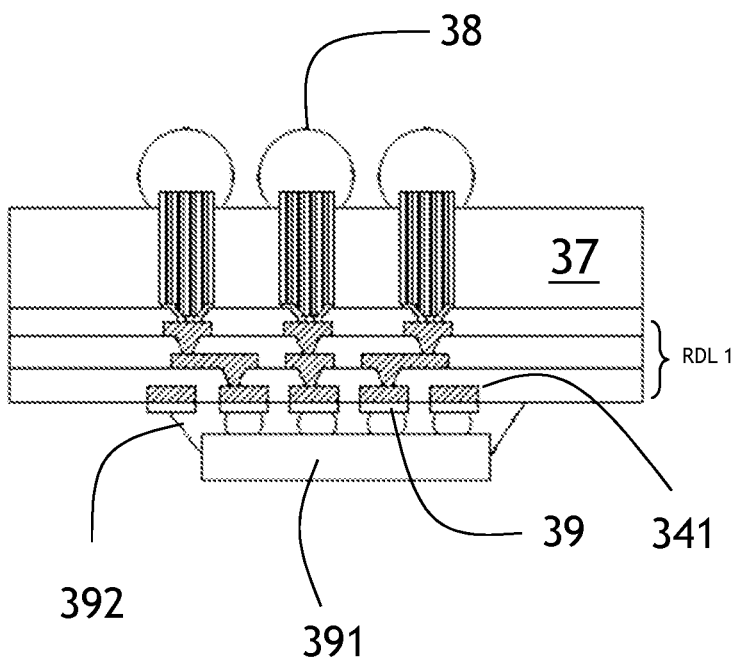

FIG. 4G Shows an IC Package Unit Obtained through Singulating the Product of FIG. 4F.

FIG. 4G shows an IC package which is a package based on the molding compound supported RDL of the third embodiment according to the present invention.

FIG. 4G' Shows an IC Package Unit Obtained through Singulating the Product of FIG. 4F'

FIG. 4G' shows an IC package which is a package based on the molding compound supported RDL of the fourth embodiment according to the present invention.

FIGS. 2A~2L and 5A~5C, Shows a Manufacturing Process According to the Present Invention. FIG. 5D is a Fifth Embodiment of the Present Invention. FIG. 5E is a Sixth Embodiment of the Present Invention.

The manufacturing process of FIGS. 2A~2L is the same as described in previous paragraph and omitted here for simplification.

Figure 5A:
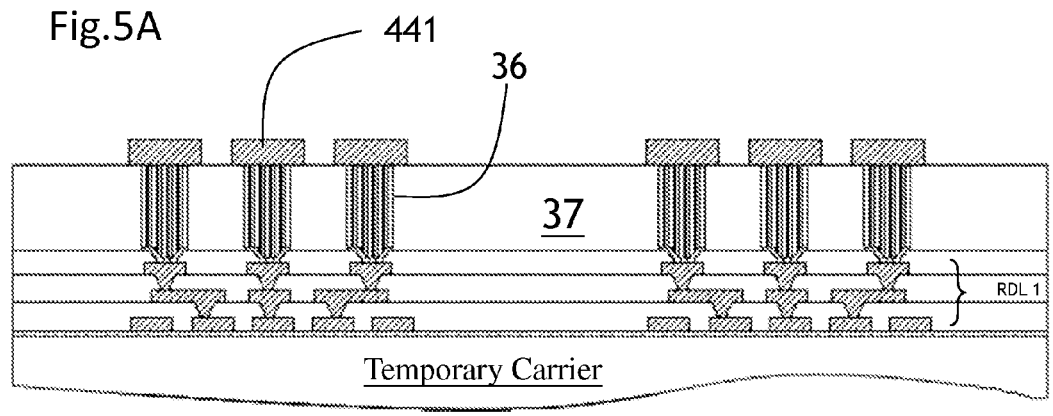
Figure 5B:
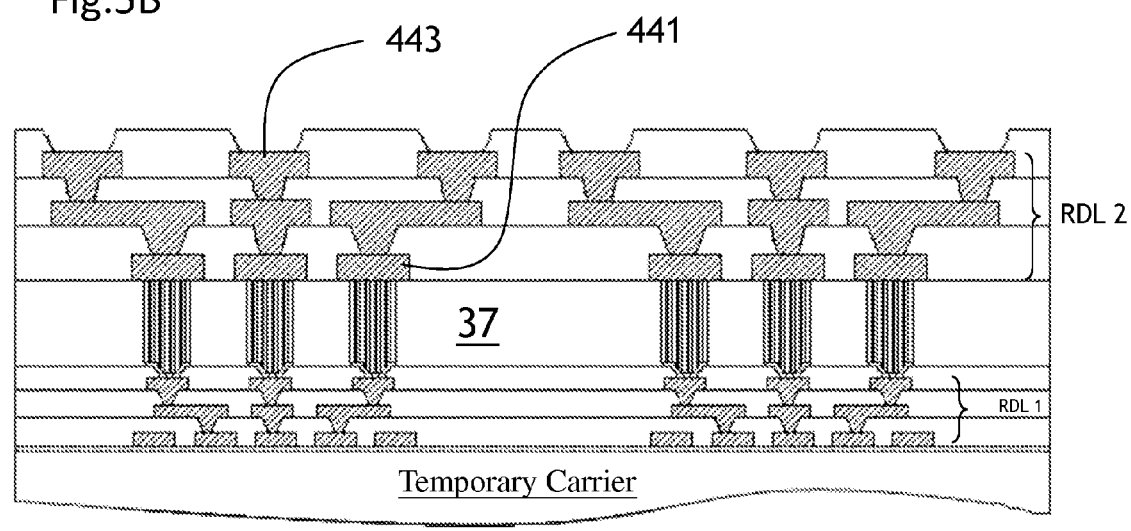
Figure 5C:
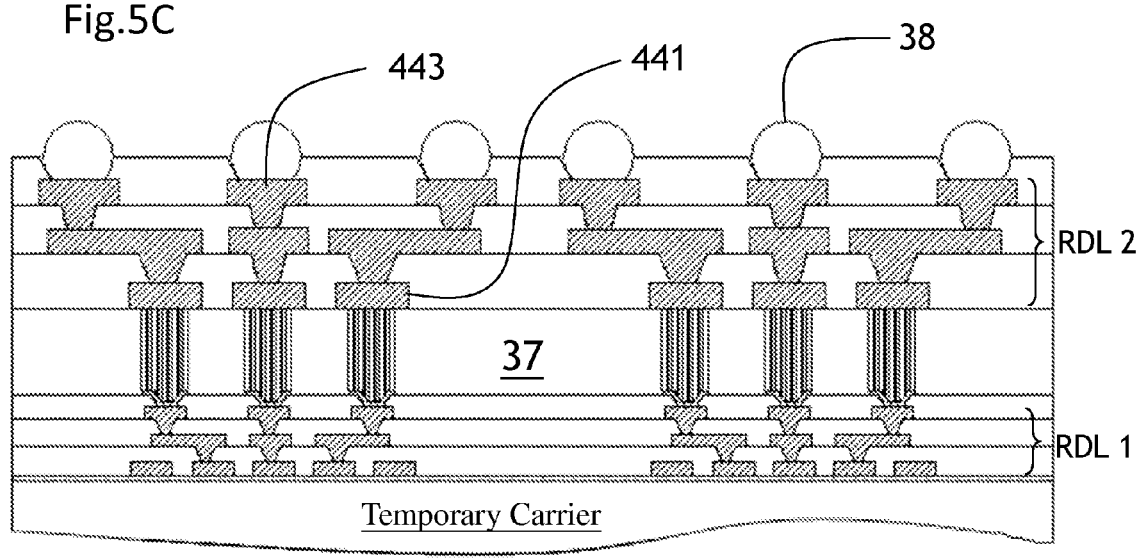
Figure 5D:
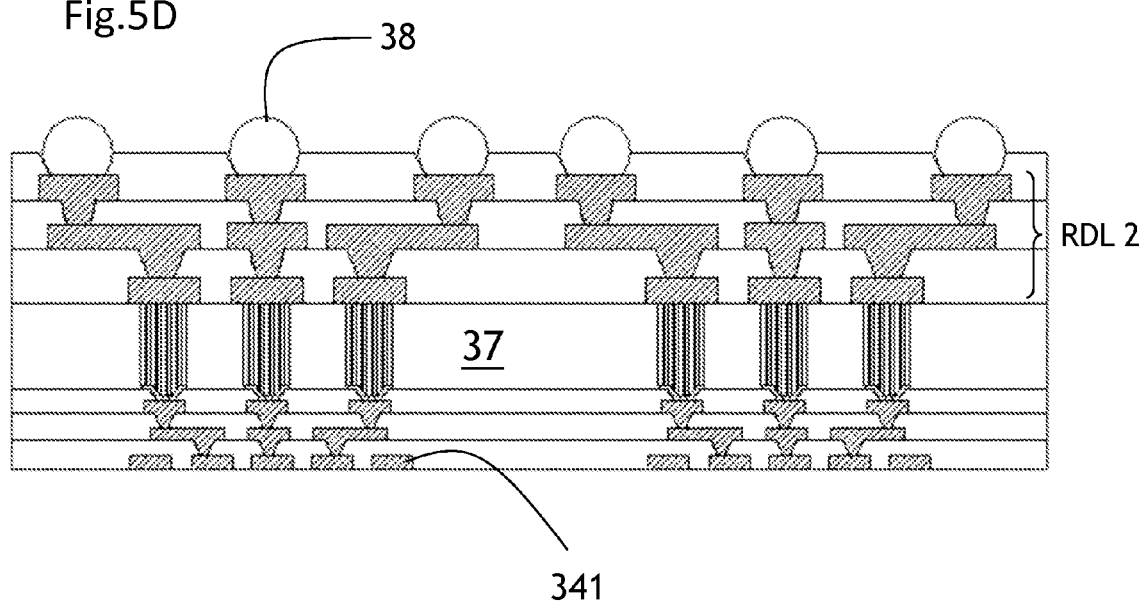
FIG. 5D is a fifth embodiment of the present invention.
Figure 5E:
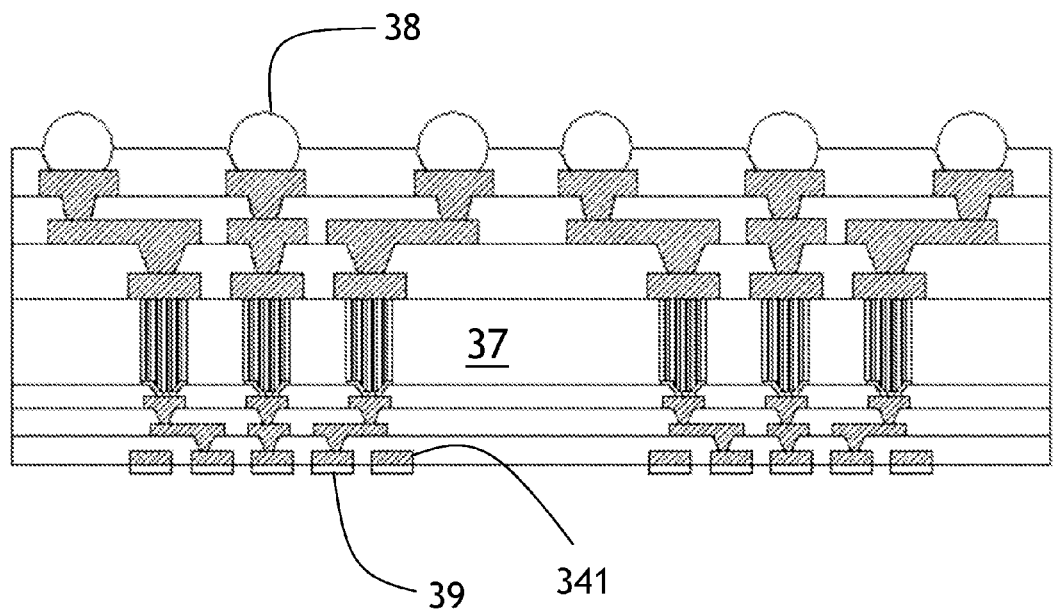
FIG. 5E is a sixth embodiment of the present invention.

FIG. 5A shows: forming a second bottom metal pad 441 on top of a corresponding metal pillar 36;

FIG. 5B shows: forming a top RDL (RDL 2) on top of the molding compound 37; forming a plurality of second top metal pad 443 on top of the top RDL (RDL 2);

FIG. 5C shows: planting a plurality of solder ball 38, each is planted on top of a corresponding second top metal pad;

FIG. 5D shows: removing the temporary carrier; and removing the bottom seed layer 32 from bottom of each first bottom metal pad 341.

FIG. 5E shows: forming a bottom protection layer 39 on bottom of a corresponding first bottom metal pad 341.

FIG. 5F Shows an IC Chip Mounted on Bottom of FIG. 5D

FIG. 5F shows an IC chip mounted on bottom of FIG. 5D; the chip 391 is electrically coupled to the first bottom metal pad 341 through a plurality of solder ball. An under fill 392 can be made between the chip 391 and the first bottom metal pad 341.

FIG. 5F' Shows an IC Chip Mounted on Bottom of FIG. 5E

FIG. 5F' shows an IC chip 391 mounted on bottom of FIG. 5E; the chip 391 is electrically coupled to the bottom protection layer 39 through a plurality of solder ball. An under fill 392 can be made between the chip 391 and the bottom protection layer 39.

Figure 5G:
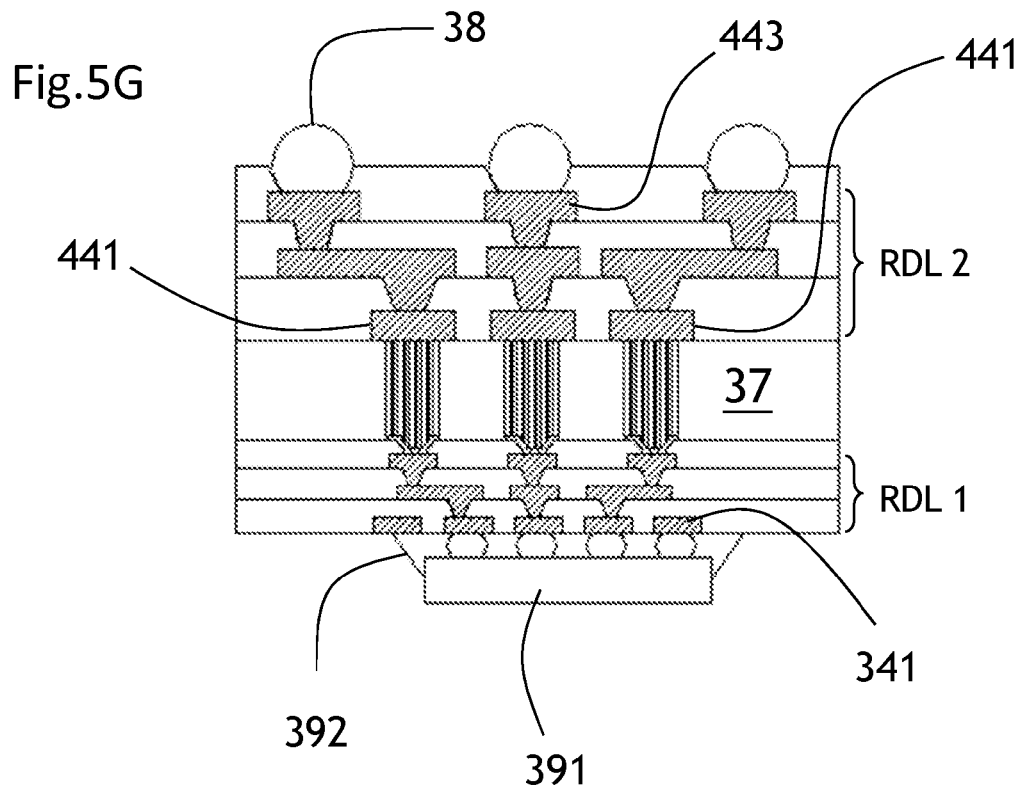
FIG. 5G shows an IC package unit obtained through singulating the product of FIG. 5F.
Figure 5G:
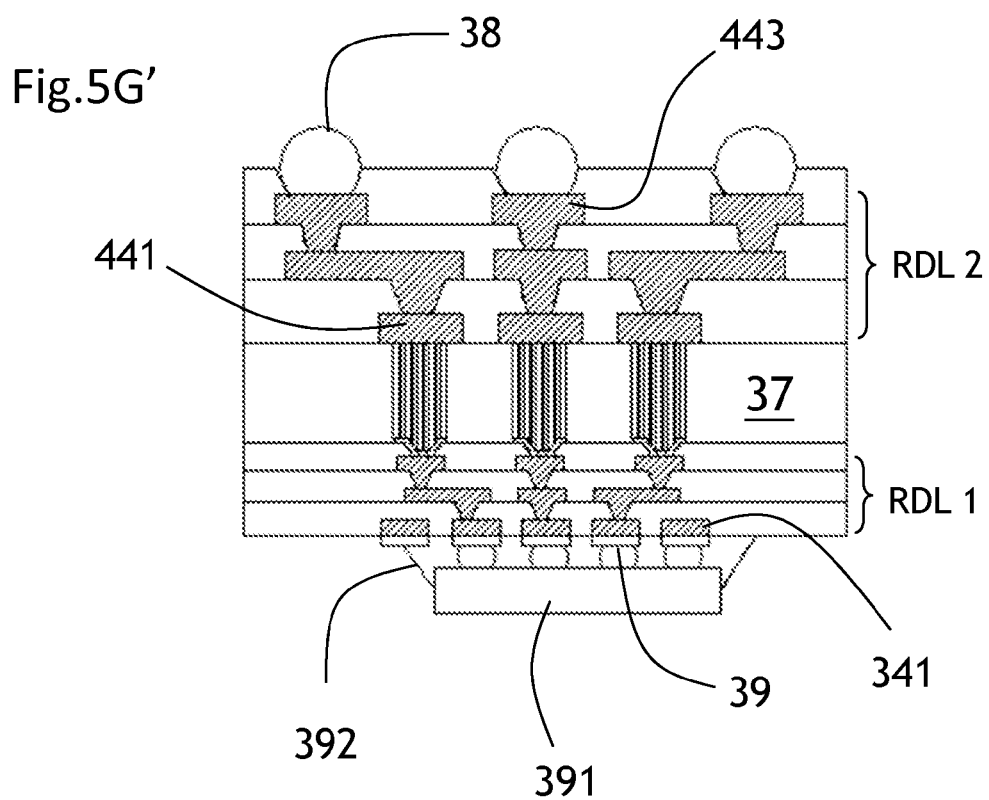

FIG. 5G Shows an IC Package Unit Obtained through Singulating the Product of FIG. 5F.

FIG. 5G shows an IC package which is a package based on the molding compound supported RDL of the fifth embodiment according to the present invention.

FIG. 5G' Shows an IC Package Unit Obtained through Singulating the Product of FIG. 5F'

FIG. 5G' shows an IC package which is a package based on the molding compound supported RDL of the sixth embodiment according to the present invention.

FIG. 6A~6M is a Seventh Embodiment of the Present Invention.

Figure 6A:
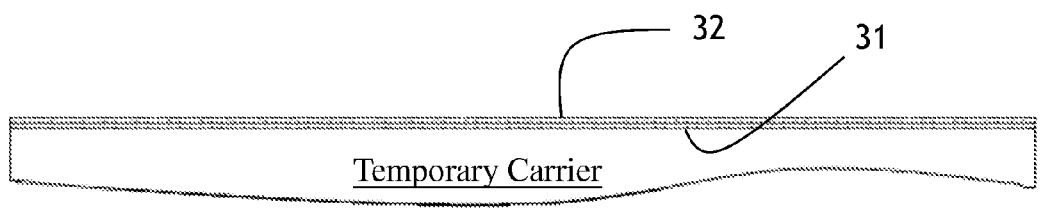
'
FIG. 6A~6M is a seventh embodiment of the present invention.

FIG. 6A shows: preparing a temporary carrier; applying a release layer 31 on top of the temporary carrier; and applying a bottom seed layer 32 on top of the release layer 31.

Figure 6B:
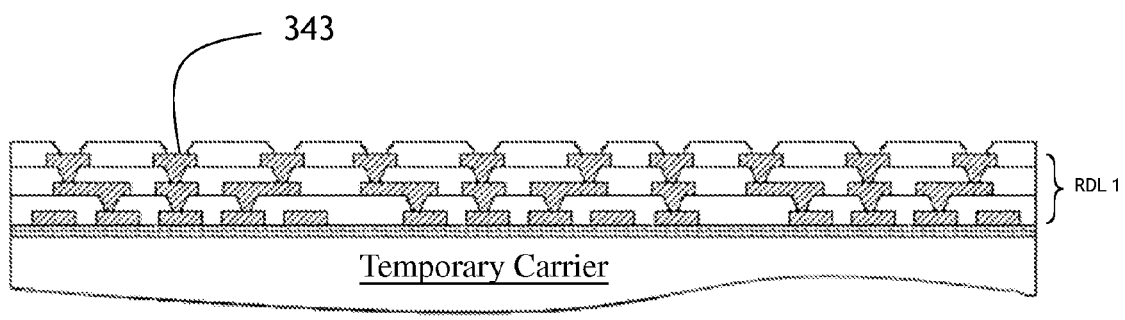

FIG. 6B shows: forming a redistribution layer RDL1 on top of the seed layer 32.

Figure 6C:
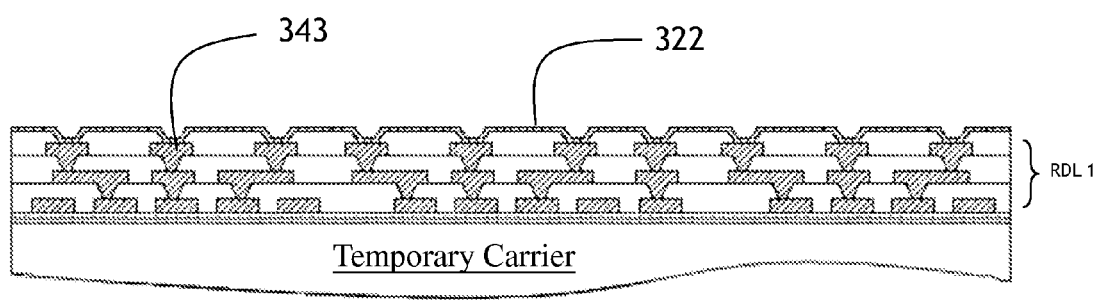

FIG. 6C shows: forming a seed layer 322 on top of the redistribution layer RDL1.

Figure 6D:
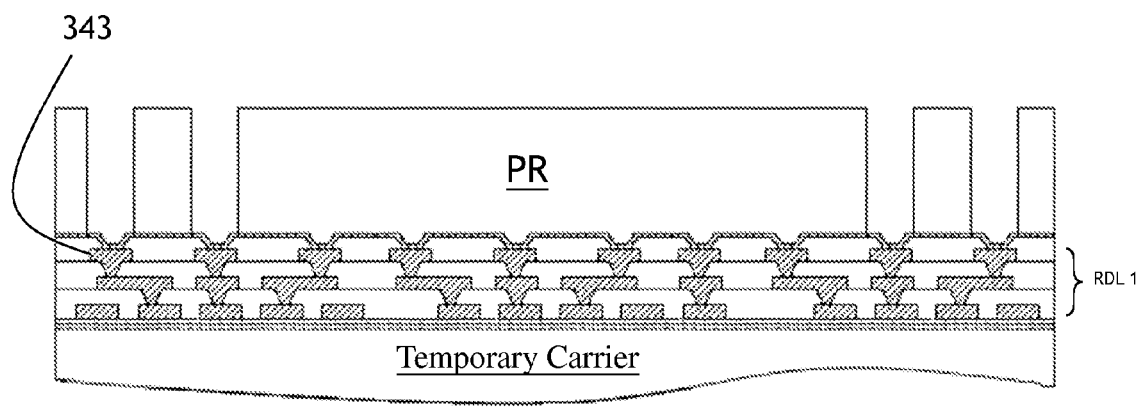

FIG. 6D shows: forming a patterned photo-resist PR on top of the seed layer 322.

Figure 6E:
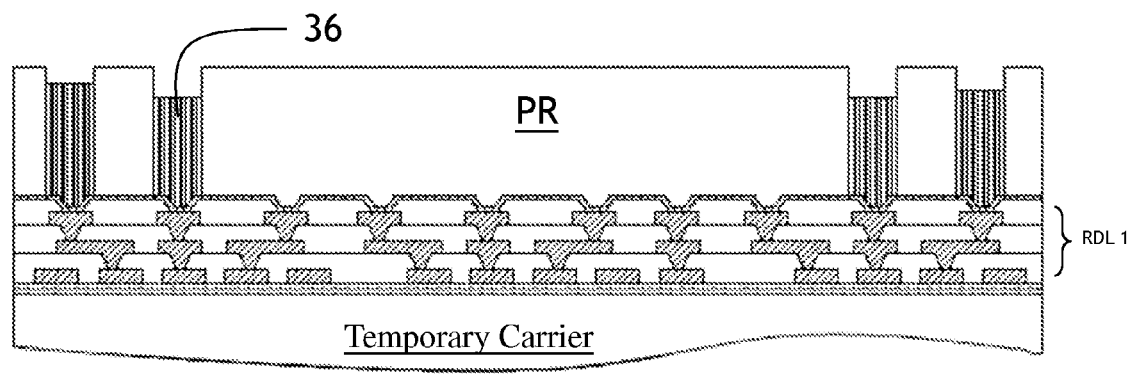

FIG. 6E shows a plurality of metal pillar 36 is formed in the periphery of the package unit.

Figure 6F:
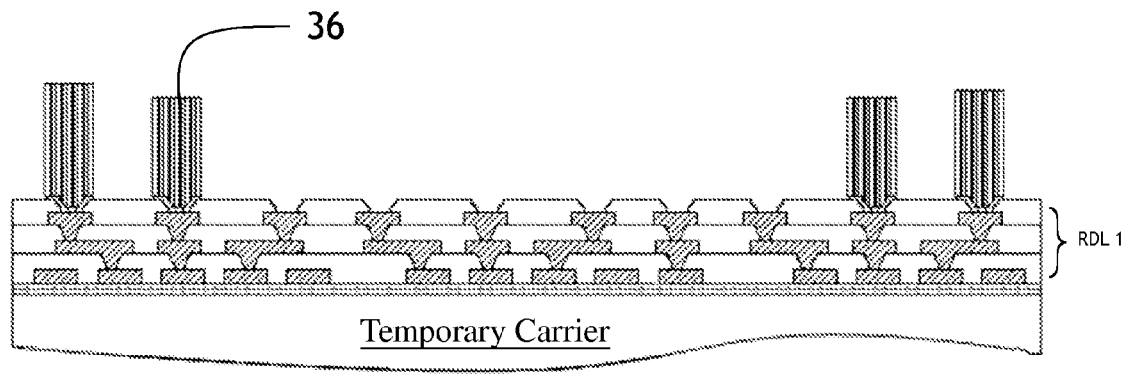
Figure 6G:
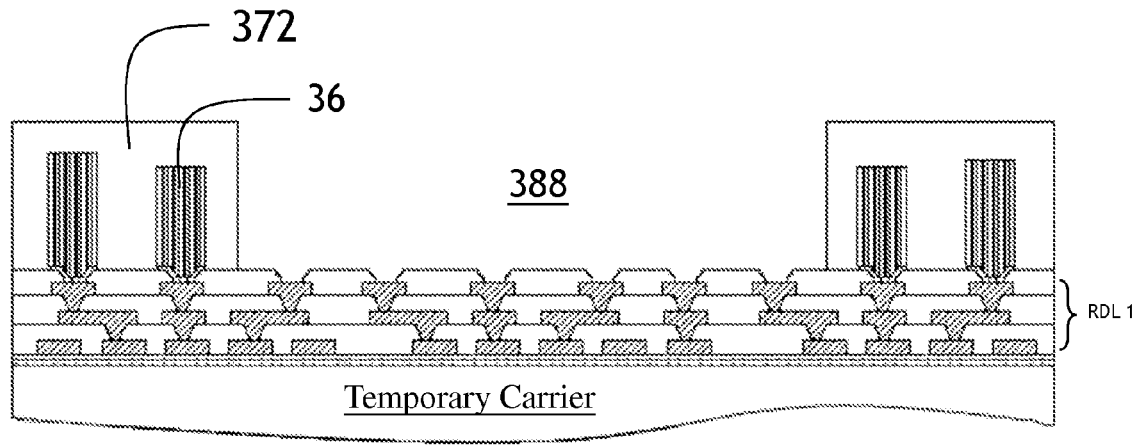

FIG. 6F shows stripping the photo resist PR, and revealing the plurality of metal pillar 36;

FIG. 6G shows applying a cylindrical molding compound 372 to encapsulate the plurality of metal pillar 36 to form a central cavity 388 in the center of the cylindrical molding compound 372.

Figure 6H:
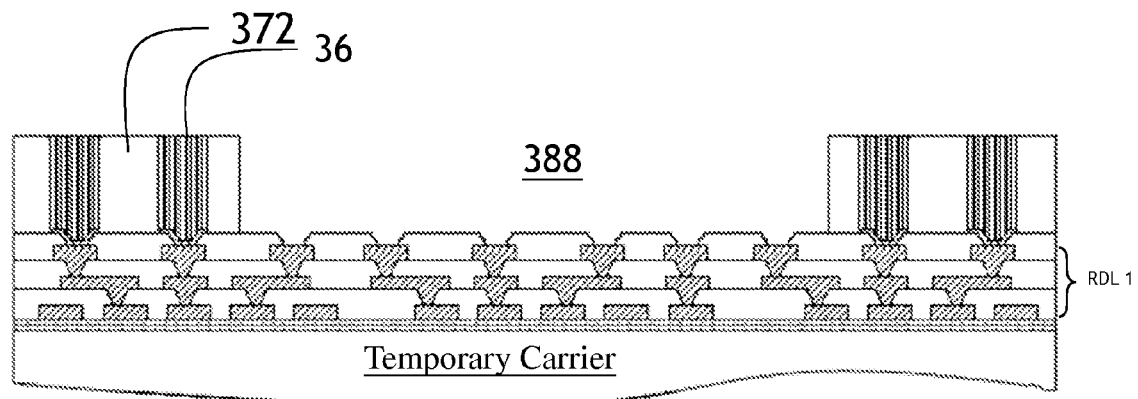

FIG. 6H shows thinning from top of the molding compound 372, and revealing a top of each metal pillar 36.

Figure 6I:
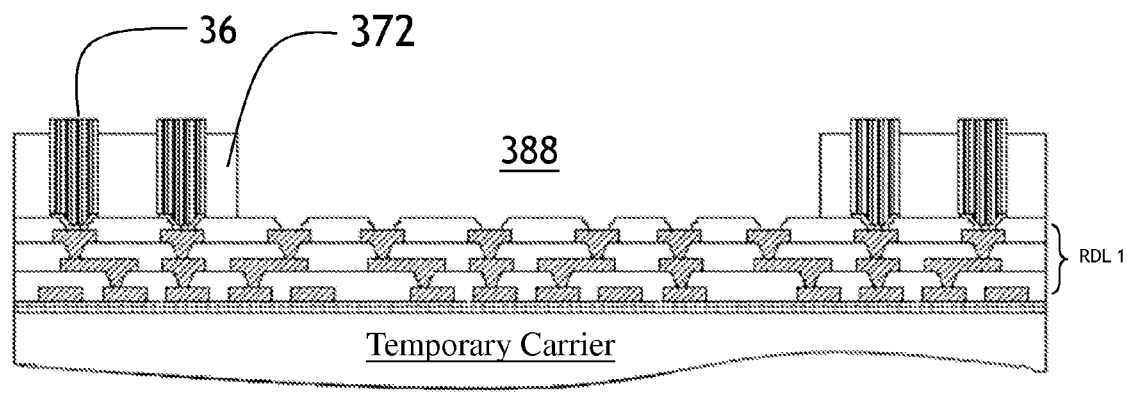
Figure 6J:
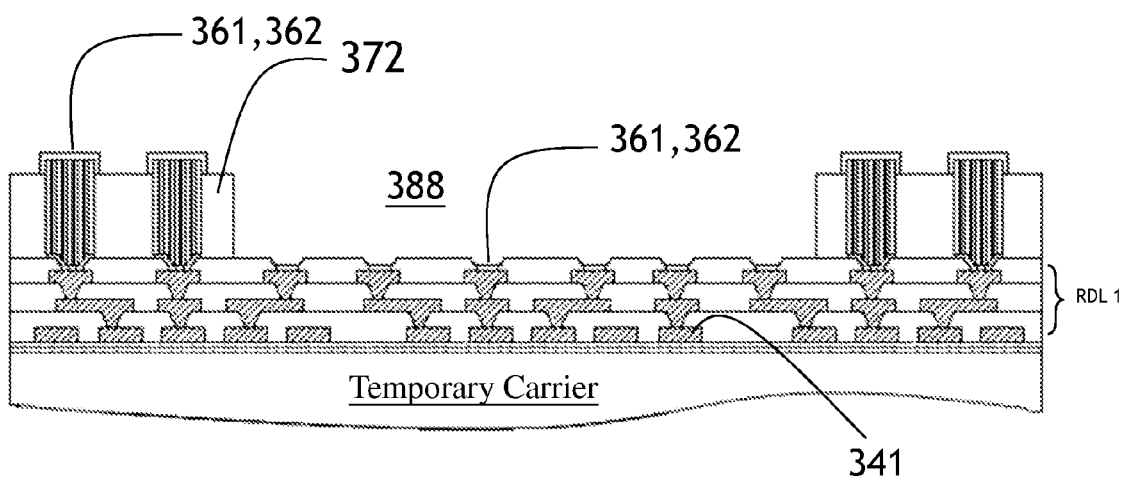
Figure 6K:
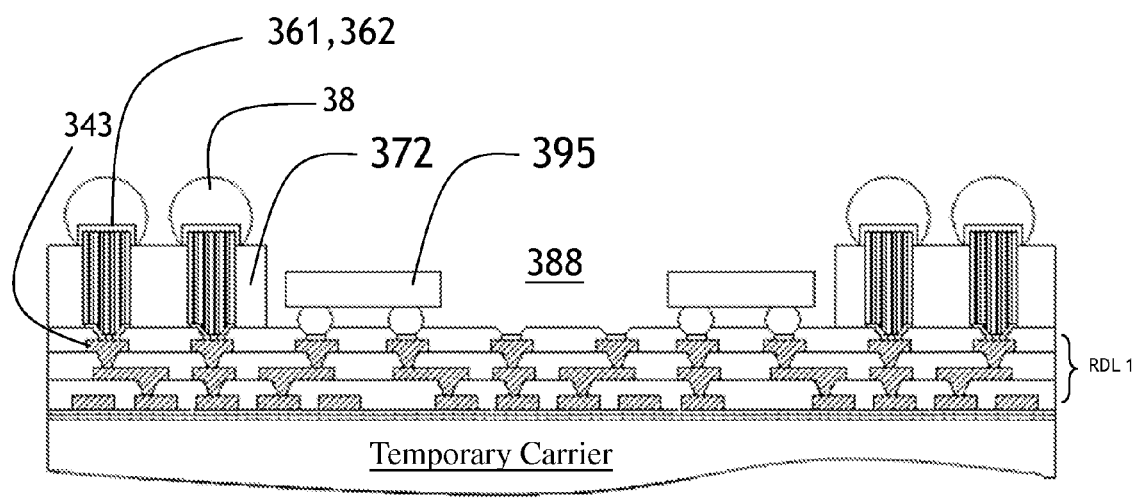

FIG. 6I shows removing portion of the molding compound 372 from top, and revealing a top end of each metal pillar 36;

FIG. 6J shows forming a protection layer 361, such as an ENEPIG 362 on each revealed top of the metal pillar 36;

FIG. 6K shows planting a plurality of solder ball 38, each is planted on top of a corresponding ENEPIG 362 which brackets a top end of a corresponding metal pillar 36; mounting at least one passive element 395 such as a capacitor in the central cavity 388.

Figure 6L:
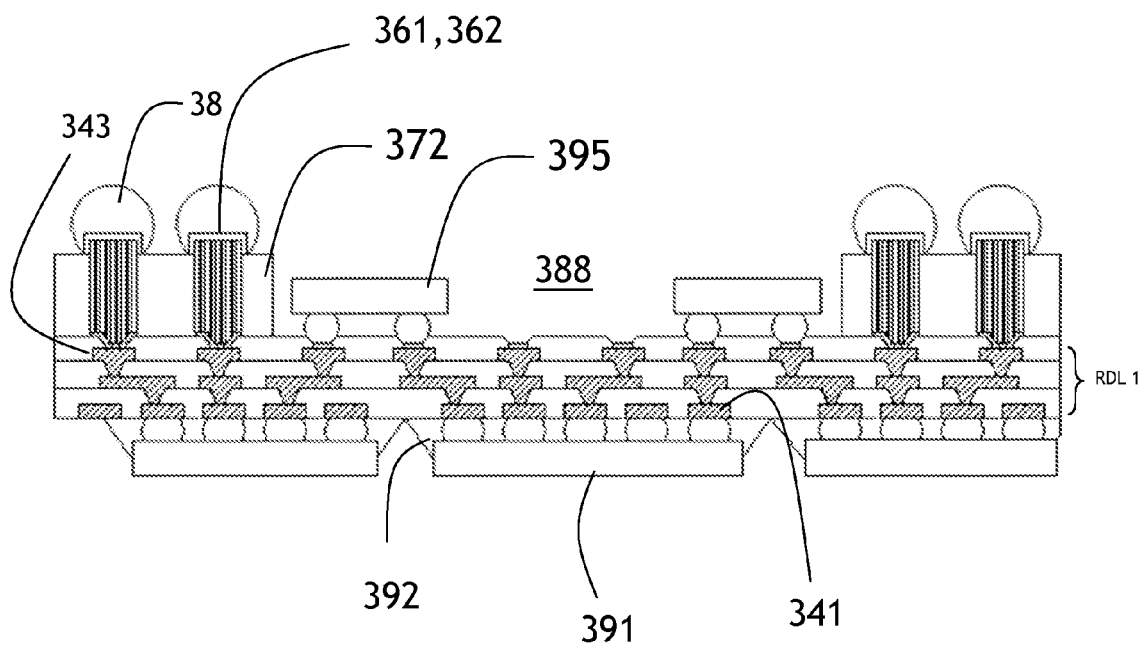

FIG. 6L shows removing the temporary carrier, removing the seed layer 32, and attaching at least one IC chip 391 from bottom of the package.

Figure 6M:
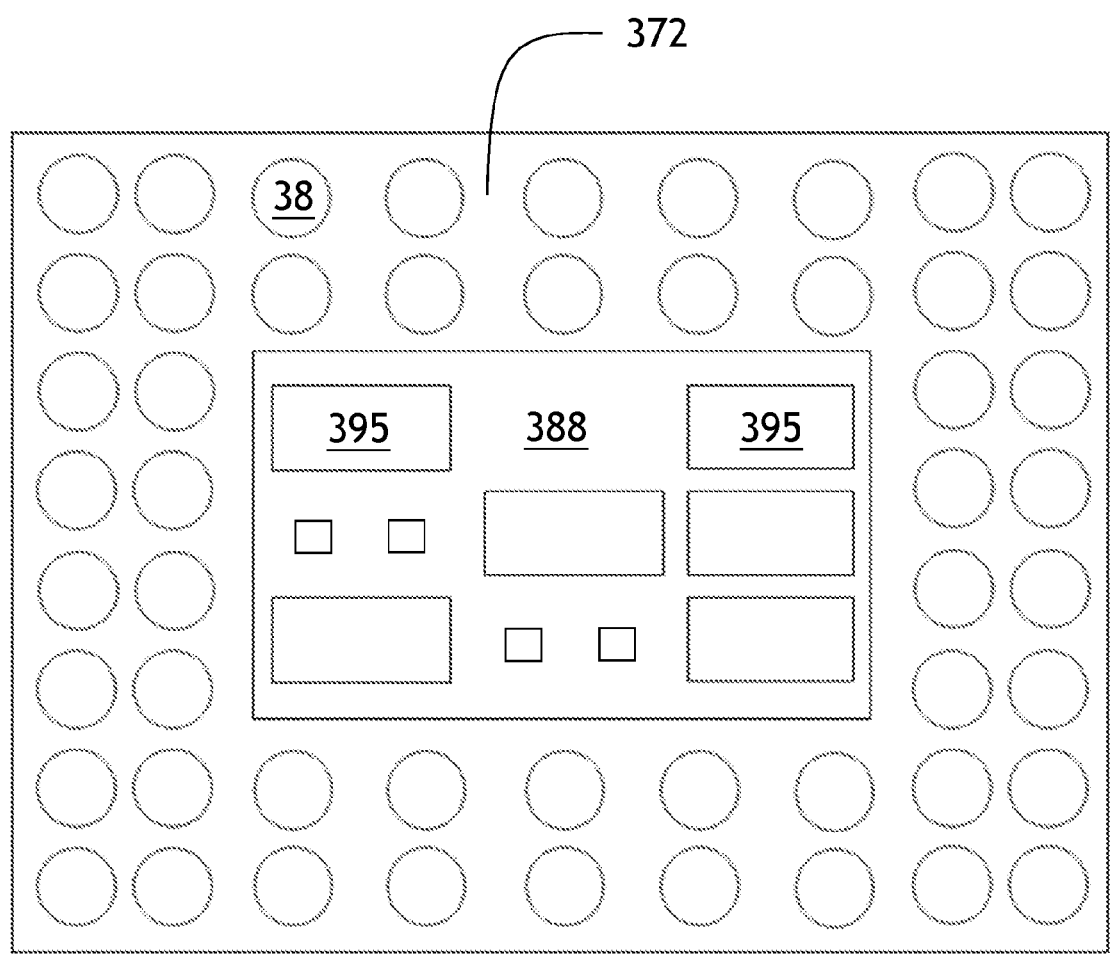

FIG. 6M shows a top view of FIG. 6H. FIG. 6I shows least a capacitor 395 is configured in the central cavity 388. The central cavity 388 is surrounded by the cylindrical molding compound 372.

The passive element 395 is configured near the bottom chip 391; the close distance shortens the circuit trace therebetween so that simultaneously switching noise (SSN) can be reduced to a minimum at a first stage when power is on for the IC package.

While several embodiments have been described by way of example, it will be apparent to those skilled in the art that various modifications may be configured without departs from the spirit of the present invention. Such modifications are all within the scope of the present invention, as defined by the appended claims.

What is claimed is:

1. A molding compound supported redistribution layer (RDL) structure for an integrated circuit (IC) package, the molding compound supported RDL structure comprising:
   a molding compound;
   a central cavity surrounded by the molding compound;
   a plurality of metal pillars partially embedded in the molding compound, each metal pillar among the plurality of metal pillars having a bottom end protruded below the molding compound;
   a redistribution layer having a plurality of bottom metal pads and a plurality of top metal pads; and
   a chip mounted on bottom of the plurality of bottom metal pads;
   wherein
   a density of the plurality of bottom metal pads is higher than the density of the plurality of top metal pads;
   the bottom end of each metal pillar among the plurality of metal pillars is electrically coupled to a corresponding top metal pad among the plurality of top metal pads;
   at least one of the plurality of top metal pads is located in the central cavity and is configured for mounting at least one passive element;
   in a thickness direction of the RDL structure, the redistribution layer is arranged between the chip and the plurality of metal pillars;
   the redistribution layer further comprises a topmost dielectric layer; and
   the plurality of top metal pads and the bottom end of each metal pillar among the plurality of metal pillars are embedded in the topmost dielectric layer.

2. A molding compound supported RDL structure as claimed in claim 1, further comprising:
   a top protection layer bracketing a top end of a corresponding metal pillar among the plurality of metal pillars.

3. A molding compound supported RDL structure as claimed in claim 2, wherein the top protection layer is selected from the group consisting of Electroless Nickel/ Electroless Palladium/ Immersion Gold (ENEPIG) and Organic Solderability Preservatives (OSP).

4. A molding compound supported RDL structure as claimed in claim 2, further comprising:
   a plurality of solder balls, each configured on top of the top protection layer bracketing the top end of a corresponding metal pillar among the plurality of metal pillars.

5. A molding compound supported RDL structure as claimed in claim 4, further comprising:
   a bottom protection layer configured on bottom of a corresponding bottom metal pad among the plurality of bottom metal pads.

6. A molding compound supported RDL structure as claimed in claim 5, wherein the bottom protection layer is selected from the group consisting of ENEPIG and OSP.

7. A molding compound supported RDL structure as claimed in claim 1, further comprising:
   at least one passive element mounted over said at least one of the plurality of top metal pads located in the central cavity,
   wherein said chip is electrically connected to the at least one passive element by the redistribution layer arranged, in the thickness direction, between the chip and the at least one passive element.

8. A molding compound supported RDL structure as claimed in claim 7, wherein
   the at least one passive element overlaps the chip in the thickness direction of the redistribution layer.

9. A molding compound supported RDL structure as claimed in claim 8, wherein
   the molding compound has a topmost surface and a bottommost surface,
   each metal pillar among the plurality of metal pillars extends from the topmost surface of the molding compound, through an entire thickness of the molding compound, to and further beyond the bottommost surface of the molding compound, and terminates at the bottom end protruded below the bottommost surface of the molding compound, and the at least one passive element is co-elevational with the molding compound.

10. A molding compound supported RDL structure as claimed in claim 9, wherein the at least one passive element comprises a plurality of passive elements arranged in the central cavity, and adjacent passive elements among the plurality of passive elements have respective sidewalls physically spaced from each other.

11. A molding compound supported redistribution layer (RDL) structure for an integrated circuit (IC) package, the molding compound supported RDL structure comprising:

a molding compound;

a central cavity surrounded by the molding compound;

a plurality of metal pillars partially embedded in the molding compound, each metal pillar among the plurality of metal pillars having a bottom end protruded below the molding compound;

a plurality of solder balls, each directly configured on top of a corresponding metal pillar among the plurality of metal pillars;

a redistribution layer having a plurality of bottom metal pads and a plurality of top metal pads; and a chip mounted on bottom of the plurality of bottom metal pads, wherein a density of the plurality of bottom metal pads is higher than the density of the plurality of top metal pads;

the bottom end of each metal pillar among the plurality of metal pillars is electrically coupled to a corresponding top metal pad among the plurality of top metal pads;

at least one of the plurality of top metal pads is located in the central cavity and is configured for mounting at least one passive element; and in a thickness direction of the RDL structure, the redistribution layer is arranged between the chip and the plurality of metal pillars.

12. A molding compound supported RDL structure as claimed in claim 11, further comprising:

a bottom protection layer configured on bottom of a corresponding bottom metal pad among the plurality of bottom metal pads.

13. A molding compound supported RDL structure as claimed in claim 12, wherein the bottom protection layer is selected from the group consisting of ENEPIG and OSP.

14. A fabricating process for a molding compound supported redistribution layer (RDL) structure for an integrated circuit (IC) package, the fabricating process comprising:

applying a release layer on top of a temporary carrier;

applying a bottom seed layer on top of the releasing layer;

forming a redistribution layer on top of the bottom seed layer, the redistribution layer having a plurality of bottom metal pads and a plurality of top metal pads;

applying a top seed layer on top of the redistribution layer;

forming a patterned photo resist on top of the top seed layer;

forming a plurality of metal pillars, each on top of a corresponding top metal pad among the plurality of top metal pads;

stripping the patterned photo resist;

stripping the top seed layer between the plurality of metal pillars;

applying a molding compound to encapsulate the plurality of metal pillars and to form a central cavity in a center of the molding compound;

thinning the molding compound from top to expose top surfaces of the plurality of metal pillars; and mounting a chip on bottom of the plurality of bottom metal pads to obtain the molding compound supported RDL structure comprising:

the molding compound;

the central cavity surrounded by the molding compound;

the plurality of metal pillars partially embedded in the molding compound, each metal pillar among the plurality of metal pillars having a bottom end protruded below the molding compound;

the redistribution layer having the plurality of bottom metal pads and the plurality of top metal pads; and the chip mounted on bottom of the plurality of bottom metal pads, wherein a density of the plurality of bottom metal pads is higher than the density of the plurality of top metal pads;

the bottom end of each metal pillar among the plurality of metal pillars is electrically coupled to a corresponding top metal pad among the plurality of top metal pads;

at least one of the plurality of top metal pads is located in the central cavity and is configured for mounting at least one passive element;

in a thickness direction of the RDL structure, the redistribution layer is arranged between the chip and the plurality of metal pillars;

the redistribution layer further comprises a topmost dielectric layer; and the plurality of top metal pads and the bottom end of each metal pillar among the plurality of metal pillars are embedded in the topmost dielectric layer.

15. A fabricating process as claimed in claim 14, further comprising:

after said thinning, removing a portion of the molding compound from top to expose top ends of the plurality of metal pillars;

forming a protection layer bracketing the exposed top end of each metal pillar among the plurality of metal pillars;

planting a plurality of solder balls, each on top of the top protection layer which brackets the top end of a corresponding metal pillar among the plurality of metal pillars;

removing the temporary carrier; and removing the bottom seed layer.

16. A fabricating process as claimed in claim 15, further comprising:

forming a bottom protection layer on bottom of a corresponding bottom metal pad among the plurality of bottom metal pads.

17. A fabricating process as claimed in claim 14, further comprising:

forming a protection layer bracketing the exposed top end of each metal pillar among the plurality of metal pillars;

planting a plurality of solder balls, each on top of the top protection layer which brackets the top end of a corresponding metal pillar among the plurality of metal pillars, wherein the top protection layer is cleaned out by soldering flux and heat and each of the plurality of solder balls is directly configured on top of a corresponding metal pillar among the plurality of metal pillars;

removing the temporary carrier; and removing the bottom seed layer.

18. A fabricating process as claimed in claim 17, further comprising:

forming a bottom protection layer on bottom of a corresponding bottom metal pad among the plurality of bottom metal pads.

19. A fabricating process as claimed in claim 14, further comprising:

mounting at least one passive element over at least one of the plurality of top metal pads located in the central cavity, wherein said chip is electrically connected to the at least one passive element by the redistribution layer arranged, in the thickness direction, between the chip and the at least one passive element.

* * * * *